United States Patent
Sinclair et al.

(10) Patent No.: US 8,110,815 B2
(45) Date of Patent: Feb. 7, 2012

(54) VAPOR DELIVERY TO DEVICES UNDER VACUUM

(75) Inventors: Frank Sinclair, Quincy, MA (US); Douglas R. Adams, Pepperell, MA (US); Brent M. Copertino, Waltham, MA (US)

(73) Assignee: Semequip, Inc., North Billerica, MA (US)

( * ) Notice: Subject to any disclaimer, the term of this patent is extended or adjusted under 35 U.S.C. 154(b) by 134 days.

(21) Appl. No.: 12/299,702

(22) PCT Filed: Jun. 11, 2007

(86) PCT No.: PCT/US2007/070900
§ 371 (c)(1),
(2), (4) Date: Nov. 5, 2008

(87) PCT Pub. No.: WO2007/146888
PCT Pub. Date: Dec. 21, 2007

(65) Prior Publication Data
US 2009/0179157 A1 Jul. 16, 2009

Related U.S. Application Data

(60) Provisional application No. 60/804,555, filed on Jun. 12, 2006, provisional application No. 60/860,631, filed on Nov. 22, 2006.

(51) Int. Cl.
*H01J 37/08* (2006.01)
(52) U.S. Cl. .................................. 250/425; 250/492.21
(58) Field of Classification Search .............. 250/423 R, 250/424, 425, 426, 427, 492.21
See application file for complete search history.

(56) References Cited

U.S. PATENT DOCUMENTS 3,527,141 A 1/1956 Peoples
(Continued)

FOREIGN PATENT DOCUMENTS

EP 1 698 715 9/2006
(Continued)

OTHER PUBLICATIONS

U.S. Appl. No. 12/515,667, filed May 20, 2009, Adams.
(Continued)

*Primary Examiner* — Kiet T Nguyen
(74) *Attorney, Agent, or Firm* — John S. Paniaguas; Katten Muchin Rosenman LLP

(57) ABSTRACT

Providing vapor to a vapor-receiving device housed in a high vacuum chamber. An ion beam implanter, as an example, has a removable high voltage ion source within a high vacuum chamber and a vapor delivery system that delivers vapor to the ion source and does not interfere with removal of the ion source for maintenance. For delivering vapor to a vapor-receiving device, such as the high voltage ion source under vacuum, a flow interface device is in the form of a thermally conductive valve block. A delivery extension of the interface device automatically connects and disconnects within the high vacuum chamber with the removable vapor receiving device by respective installation and removal motions. In an ion implanter, the flow interface device or valve block and source of reactive cleaning gas are mounted in a non-interfering way on the electrically insulating bushing that insulates the ion source from the vacuum housing and the ion source may be removed without disturbing the flow interface device. Multiple vaporizers for solid material, provisions for reactive gas cleaning, and provisions for controlling flow are provided in the flow interface device.

35 Claims, 17 Drawing Sheets

U.S. PATENT DOCUMENTS

| | | | |
|---|---|---|---|
| 3,509,216 | A | 4/1970 | Obenland et al. |
| 2,733,348 | A | 9/1970 | Lawton |
| 5,413,139 | A | 5/1995 | Kusumoto et al. |
| 6,452,338 | B1 | 9/2002 | Horsky |
| 6,686,595 | B2 | 2/2004 | Horsky |
| 7,022,999 | B2 | 4/2006 | Horsky et al. |
| 8,013,312 | B2 | 9/2011 | Adams |
| 2002/0144655 | A1 | 10/2002 | Chiang et al. |
| 2003/0230986 | A1 | 12/2003 | Horsky et al. |
| 2004/0000647 | A1 | 1/2004 | Horsky |
| 2004/0002202 | A1 | 1/2004 | Horsky et al. |
| 2004/0188631 | A1 | 9/2004 | Horsky et al. |
| 2004/0245476 | A1 | 12/2004 | Horsky et al. |
| 2007/0210260 | A1 * | 9/2007 | Horsky et al. ............ 250/424 |

FOREIGN PATENT DOCUMENTS

| | | |
|---|---|---|
| EP | 07812100 | 7/2011 |
| EP | 07812115 | 7/2011 |
| WO | WO 01/29282 | 4/2001 |
| WO | WO 2005/059942 | 6/2005 |
| WO | WO 2005/060602 | 7/2005 |
| WO | ISR PCT/US07/71010 | 6/2007 |

OTHER PUBLICATIONS

U.S. Appl. No. 12/296,601, filed Oct. 9, 2008, Horsky.
U.S. Appl. No. 12/300,918, filed Nov. 14, 2008, Horsky.
N.N. Greenwood, A. Earnshaw, *Chemistry of the Elements*, Butterworth and Heinemann Ltd, 1984, pp. 637-697.

* cited by examiner

VAPOR DELIVERY TO DEVICES UNDER VACUUM

CROSS REFERENCE TO RELATED APPLICATIONS

This application is the U.S. national phase under 35 U.S.C §371 of International Patent Application No. PCT/US2007/070900, filed Jun. 11, 2007, which claims priority to and the benefit of U.S. Provisional Patent Application No. 60/804,555, filed Jun. 12, 2006, which claims priority to U.S. Provisional Patent Application No. 60/860,631, filed Nov. 22, 2006.

TECHNICAL FIELD

This invention relates to the generation and delivery of vapor to vapor-receiving devices within high vacuum chambers. It also relates to delivery of ionizable vapor to high voltage ion sources that provide ion beams for ion implantation in the manufacture of semi-conductor devices.

BACKGROUND

In industry it is frequently desired to deliver highly toxic, unstable material in vapor form to devices within a high vacuum system. It is necessary to periodically service such devices for cleaning or replacement of parts and to refill the vapor sources and perform maintenance service. Each instance of refilling or service requires disengagement and re-engagement of vacuum seals and performance of re-qualification tests to ensure safety.

A particularly important example of such vapor delivery, having many stringent requirements, is the handling of doping materials for production of semiconductor devices. In this case it is necessary to produce vapor streams at accurately controlled flow from highly toxic solid materials that have low vapor pressure at room temperature. This requires careful heating of the solids to produce sublimation, and careful handling of the vapors because of risks of disassociation, unwanted condensation in the flow path and reaction of the vapors if brought in contact with other substances. Provisions to ensure personnel safety are also required. Improved systems for such vapor delivery are needed.

In particular there is need for improved vapor delivery for ion beam implantation systems in which the vapors ionized in an ion source produce an ion beam which is accelerated, mass-analyzed, and transported to a target substrate. With such ionization systems, it is especially desired to meet all requirements while prolonging the uptime, i.e. the time between required servicing. An advantageous way of doing this is by providing in situ cleaning of components of the system using highly reactive agents, but this introduces further safety concerns.

There is also need for safe and reliable vapor delivery systems that enable the same equipment to be employed with a number of different source materials that have differing vaporization temperatures.

There is further a need for a way to progress efficiently and safely from delivery of feed material obtained from a vendor to connection to a vapor receiving system of a vaporizer charged with the feed material. It is preferable that this be done in a standardized manner, to ensure familiarity to personnel.

Among the situations having all of the foregoing needs is the case of providing flows of decaborane and octadecaborane vapor, and vapor of carboranes, to an ion source at flows suitable to perform ion beam implantation to produce boron implants.

The needs also arise, more generally, in providing vapor flows of large molecules for semiconductor manufacturing. Examples include vapor flows: of large molecules for n-type doping, e.g. of arsenic and phosphorus; of large molecules of carbon for co-implanting processes in which the carbon inhibits diffusion of an implanted doping species, or getters (traps) impurities, or amorphizes crystal lattice of the substrate; of large molecules of carbon or other molecules for so-called "stress engineering" of crystal structure (e.g., to apply crystal compression for PMOS transistors, or crystal tension for NMOS transistors); and of large molecules for other purposes including reduction of the thermal budget and unwanted diffusion during annealing steps in semiconductor manufacture.

These needs apply to implementations employing ion beam implantation, and, where applicable, also to large molecule deposition of boron and other species for atomic layer deposition or producing other types of layers or deposits. Techniques for this may employ: plasma immersion, including PLAD (plasma doping), PPLAD (pulsed plasma doping) and $PI^3$ (plasma immersion ion implantation); atomic layer deposition (ALD); or chemical vapor deposition (CVD), for example.

The needs just described and the inventive aspects now to be described apply importantly to the manufacture of high density semiconductor devices at shallow depth in semiconductor substrates, including CMOS and NMOS transistors and memory ICs, in the manufacture of computer chips, computer memory, flat panel displays, photovoltaic devices, and other products.

Other procedures in industry involving the generation and delivery of vapors or process gases to a vapor or gas consuming device can also benefit from features presented here.

SUMMARY

As a first aspect of invention, a vapor delivery system comprises a high vacuum chamber, a vapor-receiving device removably installed within the high vacuum chamber and a flow interface device that defines a vapor flow path, the flow interface device comprising a flow-path-defining portion located outside of the vacuum chamber and a flow-path-defining delivery extension that protrudes from the outside into the high vacuum chamber, the delivery extension having an exterior, the exterior sealed to a wall of the high vacuum chamber, the part of the flow path outside of the high vacuum chamber constructed to convey vapor from a vapor source to the delivery extension, and a disengageable flow connection within the high vacuum chamber between the delivery extension and an inlet passage associated with the removable vapor-receiving device, the system enabling any leakage at the connection to enter the vacuum within the vacuum chamber.

Implementations of this aspect of invention may have one or more of the following features:

The vapor-receiving device has a path for removal and installation that is generally horizontal and the flow interface device is mounted at a level below that path in position not to interfere with removal and installation motions of the vapor-receiving device.

The delivery extension protrudes generally upwardly into the high vacuum chamber.

The vapor-receiving device within the high vacuum chamber is a high voltage ion source and the interface device is constructed to conduct ionizable vapor to it.

The portion of the interface device outside of the vacuum chamber comprises a thermally conductive body which defines a part of the vapor path, the conductive body being associated with an electric heater.

The portion of the interface device outside of the vacuum chamber defines at least two vapor-receiving interfaces at each of which is defined a mounting station for a heated vaporizer, the interface device having passages for delivering vapor from each of the vaporizers to the vapor-receiving device via the delivery extension.

The interface device includes a valve system constructed to enable selection of flow from the vaporizers.

For use with a vaporizer constructed to generate vapor at pressure exceeding the pressure of the desired flow to the vapor-receiving device, a throttle valve is included in the flow path of the flow interface device to regulate flow to the vapor-receiving device through the delivery extension.

Where the vapor-receiving device is an ion source, the ion source is mounted within the vacuum chamber via an electrically insulating bushing, the flow interface device being located electrically on the ion source side of the insulating bushing and out of a path of removal of the ion source, in manner enabling removal of the ion source without interference by the flow interface device. In a preferred case the flow interface device is supported by a mounting structure that is connected for support to the electrically insulating bushing, and in a particularly preferred instance the mounting structure is a mounting ring to which the ion source is mounted. Also, in a preferred case, the device is suspended below the path of removal and installation of the ion source. In another case a source of reactive gas in the form of a disassociating device is supported at least indirectly via the mounting structure out of the path of removal of the ion source, for instance the disassociating device is suspended from the flow interface device which in turn is suspended from the mounting structure. Preferably the flow interface device defines, at a vapor-inlet port connected to the vapor path, a station for removably mounting a heated vaporizer for vaporizing solid material, whereby the vaporizer is supported by the flow interface device which in turn is suspended from the mounting structure. In a preferred case the flow interface device has vapor inlet ports at mounting stations for removably mounting at least two heated vaporizers for vaporizing solid materials and a valve system enables flow from a selected vaporizer through the flow path. It is preferred that separate vapor inlet paths of the flow interface device dedicated to respective vaporizers merge into a common vapor delivery path, a common throttle valve for control of vapor flow is located along the common passage, and a control system is provided for controlling the throttle valve.

Also, in preferred implementations of the first-mentioned aspect of invention the vapor-receiving device is capable of being installed and removed with respect to the vacuum chamber by opposite movements along a path and a terminal portion of the delivery extension of the flow interface device is disposed within the vacuum chamber in position to be engaged and disengaged by structure of the vapor-receiving device during its respective installation and removal movements along its path. In preferred implementations, the terminal portion of the delivery extension comprises a spring-loaded cam member adapted to be displaced by movement of the vapor-receiving device to form a seal with a surface of the vapor-receiving device.

Further, in preferred implementations of the first-mentioned aspect of invention the vapor receiving device is an ion source, the flow interface device is associated with a source of reactive cleaning gas, and a vapor passage extending through a portion of the delivery projection to the ion source is adapted, when the ion source is energized, to deliver solids-derived vapor from a vaporizer for ionization, and a portion of the delivery projection defines a passage enabling flow of reactive cleaning gas from the source of reactive cleaning gas to the ion source when the ion source is de-energized. Preferably the reactive gas source is a device for disassociating a flow of precursor gas or vapor to produce a flow of reactive gas, preferably it is a supplemental plasma chamber constructed to disassociate a flow of precursor gas or vapor to produce the flow of reactive gas.

Also, with the vapor receiving device an ion source, the vapor path is preferably provided within a thermally conductive body which defines a mounting station for removably receiving and communicating with a vaporizer, there being a heating system adapted to heat the conductive body. In preferred instances the flow interface device has vapor inlet ports at mounting stations for at least two vaporizers and preferably the device is combined with a set of vaporizers in which one vaporizer in the set is dedicated to decaborane and another to octadecaborane.

According to another aspect of invention, an ion implanter ion source system is provided which includes an ion implantation ion source located within a high vacuum housing combined with a vapor delivery system comprising: at least one vaporizer constructed to heat a solid feed material to its vaporization temperature to produce vapor to be ionized and a vapor passage extending to the ion source from a receiving port for vapor from the vaporizer, the vapor passage arranged to deliver solids-derived vapor from the vaporizer for ionization, the ion source mounted within the vacuum housing via an electrically insulating bushing and mounting structure connected to the bushing, the ion source being removable from the bushing and housing, the vapor delivery system being located electrically on the ion source side of the insulating bushing and being supported by the ion source mounting structure out of a path of removal of the ion source, in manner enabling removal of the ion source without interference by the vapor delivery system.

Implementations of this aspect of invention may have one or more of the following features:

A source of reactive cleaning gas associated with the ion source is also supported by at least indirectly from the mounting structure out of the path of removal of the ion source.

A delivery extension from the vapor passage extends into the evacuated space of the vacuum housing in position to be engaged and disengaged by ion source structure at an engagement region exposed to high vacuum, whereby leak of toxic vapor at the region of engagement presents no hazard to workmen. Preferably the vaporizer is constructed to generate vapor at pressure exceeding the pressure of the desired flow to the ion source, a throttle valve is included in the vapor passage to regulate the flow to the ion source, the vapor passage, including the throttle valve, being provided within a thermally conductive body, there being a heating system adapted to maintain the conductive body at temperature above that of the vaporizer producing the vapor, the conductive body being suspended from the mounting structure. Also, preferably, the conductive body defines vapor inlet ports at mounting stations for at least two vaporizers, and within the conductive body there being flow passages from the respective inlets and a valve system enables selection of flow from a vaporizer. It is advantageous to have separate vapor inlet passages dedicated to respective vaporizers merge into a common vapor delivery passage, the throttle valve for control of vapor flow is located along the common passage, and a control system provided for the generation of vapor includes a controlled power circuit for varying the level of electrical heating of a selected vaporizer. Preferably the path is substantially horizontal and the conductive body is mounted below the path in position not to interfere with ion source installation and removal movement.

According to another aspect of invention, an ion beam implantation system comprises a vacuum chamber that houses a removable ion source and a beam line for ions from the ion source, a heated vapor delivery device constructed to deliver ionizable vapor to the ion source, the vapor delivery device defining a mounting station for a vaporizer unit and a passage for a controlled flow of vapor to the ion source, the vapor delivery device constructed and positioned to enable removal of the ion source without disturbance of the vapor delivery device.

Implementations of this aspect of invention may have one or more of the following features:

The vapor delivery device is substantially supported by an electrically insulating bushing which also supports the ion source.

A delivery extension of the vapor delivery device into the vacuum chamber removably connects to an inlet passage of the ion source within the chamber.

The vapor delivery device comprises a heated conductive metal valve block that houses valves that control flow of the vapor to the ion source.

The details of one or more implementations of the foregoing features are set forth in the accompanying drawings and the description below. Other features, objects, and advantages of the invention will be apparent from the description and drawings, and from the claims.

DESCRIPTION OF EMBODIMENTS

Figure 1:
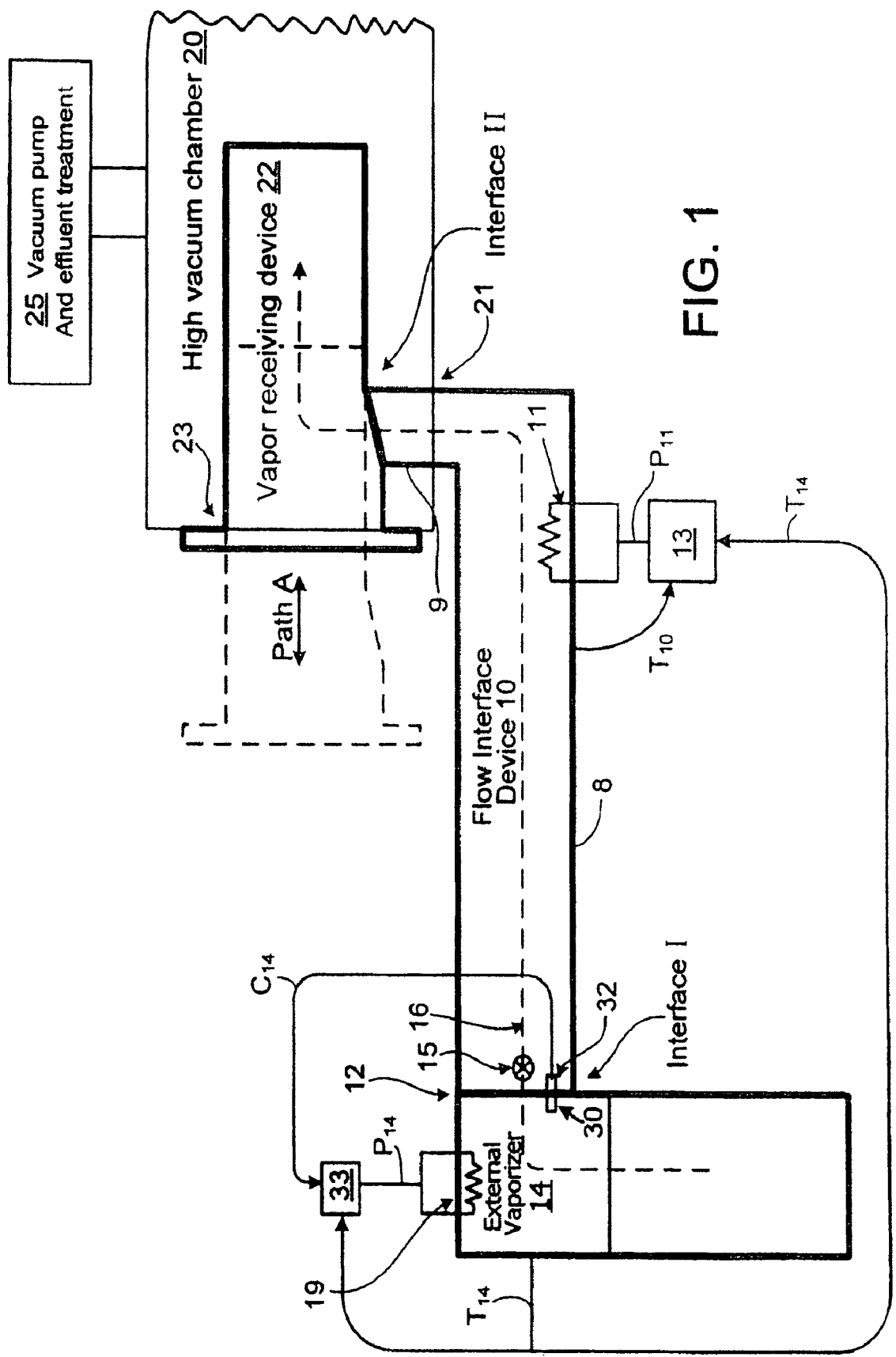
FIG. 1 is a schematic side view of a vapor delivery arrangement comprising an external vaporizer, a vapor-receiving device within a high vacuum chamber and, between these components, a flow interface device.

Referring to FIG. 1, flow interface device 10 of a vapor delivery system is connected to high vacuum chamber 20 and comprises a portion 8 located outside of the vacuum chamber and an extension 9 protruding into the vacuum chamber. Portion 8 of interface device 10 provides a mounting station 12 at which an external vaporizer 14 is removably mounted at a gas-tight interface I.

Vaporizer 14 is of canister type having a bottom section, which contains a charge of solid feed material to be vaporized, and a removable top member. The top member is associated with a vaporizer heater shown diagrammatically at 19. The interface system includes a heater control circuit 33 which controls power $P_{14}$ to the vaporizer heater which produces vapor from the feed material. A vapor flow path 16 extends in the interface device 10 from the vaporizer via the interface I, through an adjacent stop valve 15, thence through portion 8 and extension 9. The extension 9 is sealed to the housing of vacuum chamber 20 at vacuum-tight seal 21.

A sealed disengageable connection is formed between extension 9 and vapor-receiving device 22 within the high vacuum chamber. This point of connection is referred to as interface II.

With this arrangement, ready removal and servicing of both the external vaporizer 14 and the vapor-receiving device 22 is made possible without disturbance of the seal 21 at the connection of the flow interface device 10 to the housing of high vacuum chamber 20. Despite repeated flow disconnection and reconnection at interface II for performing service on vapor-receiving device 22, interface II does not present a potential leak hazard to workers because of its location. To any extent that leak may occur, the leakage is confined within high vacuum chamber 20 and is removed by its vacuum pump and associated effluent treatment system 25.

In preferred implementations of the system, at interface II, the connection is made within the high vacuum chamber by installation movement of the vapor-receiving device. In the example of FIG. 1, the vapor-receiving device 22 is installed by moving along path A until device 22 seals upon a surface of the vacuum chamber 20 at detachable connection 23. As it is installed with this motion, the vapor-receiving device 22 is constructed to engage and seal with extension 9 at interface II within the vacuum chamber 20. For instance, it may be constructed to form, effectively, a labyrinth vacuum seal by matching close-fitting surfaces. Similarly, the vapor receiving device 22 is constructed to be removable from the vacuum chamber by opposite motion along path A in a manner that breaks the seal at interface II, without disturbing the seal 21 of flow interface device 10 with the housing of vacuum chamber 20.

Figure 1A:
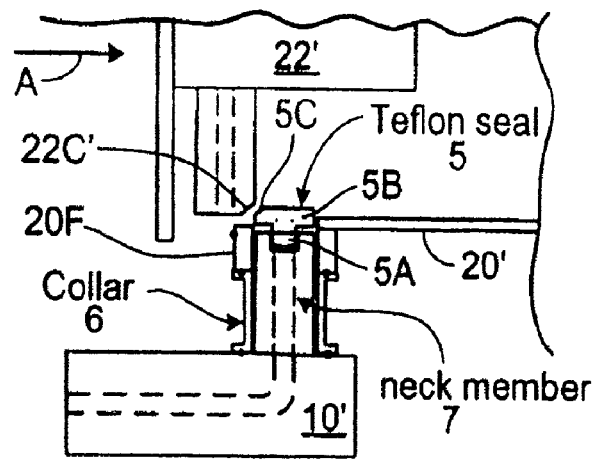
FIGS. 1A, 1B, and 1C are diagrammatic illustrations of an implementation of a sealing feature within the high vacuum chamber of FIG. 1.
Figure 1B:
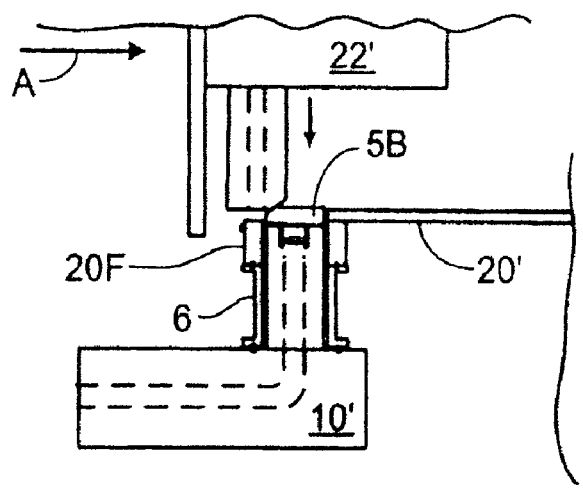
Figure 1C:
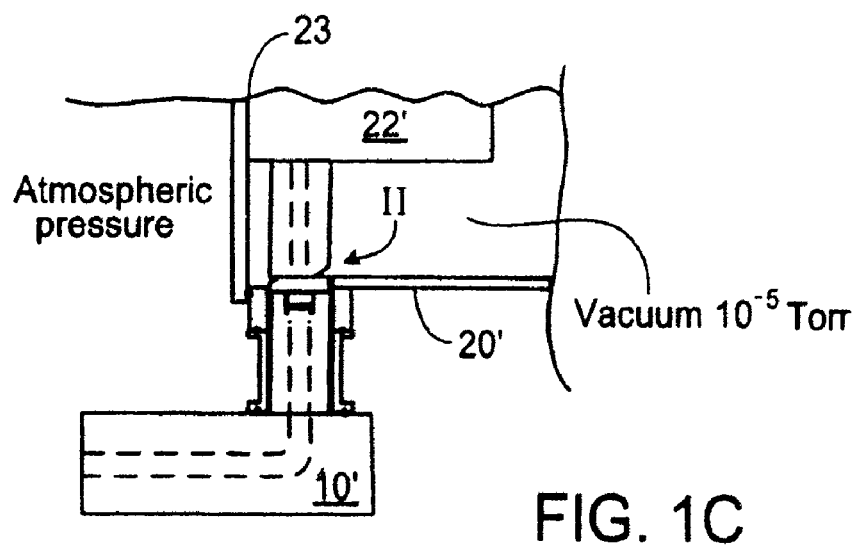

FIGS. 1A-1C illustrate a mechanism that forms such a seal at interface II within high vacuum chamber 20'. The housing of high vacuum chamber 20' includes an interface flange 20F joined in vacuum-tight manner to the housing and having an opening directed downwardly.

Flow interface device 10' is in the form of a thermally conductive block that defines a vapor flow passage. It includes a collar 6 constructed to mount the block upon housing flange 20F in vacuum tight manner. A neck member 7 joined and sealed to block 10', defines an extension of the vapor passage. Neck member 7 protrudes from the collar 6, through chamber flange 20F, into the high vacuum chamber 20'.

A spring-loaded connector seal member 5, e.g. of Teflon, has a tubular stem 5A closely fitted inside a cylindrical portion of the passage in neck member 7. The stem 5A extends upwardly into the installation path of vapor receiving device 22', terminating in a top head 5B that defines a horizontal upwardly directed sealing surface. Head 5B has a corner cam surface 5C, disposed to be engaged by a corresponding cam surface 22C' of device 22'.

In FIG. 1A, cam surfaces 5C and 22C' are shown still separated as the vapor-receiving device 22' moves to the right along path A for installation. In FIG. 1B, the device 22' has advanced to the point that the cam surfaces engage. In FIG. 1C installation is complete with the mounting flange of device 22' seated upon a corresponding flange surface of high vacuum chamber 20', forming vacuum tight seal 23. The spring-biased Teflon member 5 has been pushed downwardly and its flat top surface engages a corresponding downwardly directed flat surface of device 22'. These mating surfaces in effect form a labyrinth seal. Another labyrinth seal is formed by the close fitting cylindrical surfaces of the passage in neck member 7 and the stem 5A of the connector 5. With the flow-receiving device 22' seated, the passages of neck member 7 and the vapor-receiving device 22' are aligned to enable delivery of vapor.

For removal of the vapor-receiving device 22', the motions are reversed.

It will be understood by those skilled that other docking configurations can be employed, one example being engaging surfaces that are axially-aligned, e.g. surfaces of conical or pyramidal connectors. In other cases, after the vacuum-receiving device has been seated, a reversible actuator mechanism may be activated to complete a sealed connection between the parts within the vacuum housing.

Referring again to FIG. 1, in preferred implementations, flow interface device 10 is constructed to accept vaporizers containing different materials to be vaporized. Each vaporizer carries a temperature sensor by which the temperature $T_{14}$ of the vaporizer is sensed and sent to vaporizer heater control circuit 33 of the interface system. While shown sensing the temperature of the top of the unit, it may instead be located to sense the temperature near the bottom, with advantages, or both locations may be monitored. Each vaporizer is dedicated to a particular source material and carries an identifier device 30. The flow interface device 10 has a complementary recognition device 32. Recognition device 32 provides a control signal $C_{14}$ to vaporizer heater control circuit 33, in response to which control circuit 33 establishes a safe temperature range for heating the respective feed material including an upper limit for applying power to the heater of the particular vaporizer. As an example, in a preferred implementation, flow interface device 10 is constructed to receive vaporizers 14' and 14" dedicated to containing, respectively, decaborane and octadecaborane. The vaporizers carry distinctly different identifying devices 30. When a vaporizer is mounted to interface device 10, the recognition device 32 recognizes the vaporizer 14' or 14" and provides respective control signal $C_{14}'$ or $C_{14}"$. In a suitable implementation, the recognition signal $C_{14}'$, triggered by a decaborane vaporizer, enables the heater control circuit 33 to operate within an appropriate heating range for vaporizing decaborane and prevents heating of the vaporizer above about 35 C, while the recognition signal $C_{14}"$, triggered by an octadecaborane vaporizer, enables the heater control circuit 33 to operate within an appropriate heating range for vaporizing octadecaborane and prevents heating of the vaporizer above 135 C, for example. Other vaporizers dedicated to other materials carry other identifiers that are recognizable to cause the interface control unit to enable other temperature ranges or other appropriate operating conditions.

In preferred implementations, flow interface device 10 comprises a thermally conductive body, formed for instance of machined aluminum block-forming parts. When valves are installed, the thermally conductive block serves effectively as valve body for the valves. A vacuum-tight vapor path through the heated body extends from interface I to interface II. The body is in thermal contact with a heater shown diagrammatically at 11, controlled by circuit 13. Circuit 13 has temperature inputs $T_{14}$ from vaporizer 14 and $T_{10}$ from the conductive body of flow interface device 10. Circuit 13 is adapted to control heater 11 to maintain the conductive body at a controlled temperature, for instance, to a temperature above the temperature of the respective vaporizer 14, but below a safety temperature, e.g., a temperature below disassociation temperature of a respective material being vaporized.

The heaters of the system may be of various forms, for instance conventional electric cartridge or band heaters, and may be arranged in one or more than one heating zone. For instance, advantageously, there may be a heating zone 1 for heating the vaporizer to $T_1$, heating zone 2 for heating the interface body 10 and heating zone 3 for the vapor-receiving device 22. The heating zones are comprised of respective heater elements and temperature sensors, that, in one arrangement, increase in temperature from $T_1$ to $T_2$ along the path from vaporizer to interface II in the vapor receiving device, i.e. $T_1 < T_2 < T_3$ where all of these temperatures are limited to a temperature $T_4$ below a safety limit for the material to be vaporized.

Figure 1D:
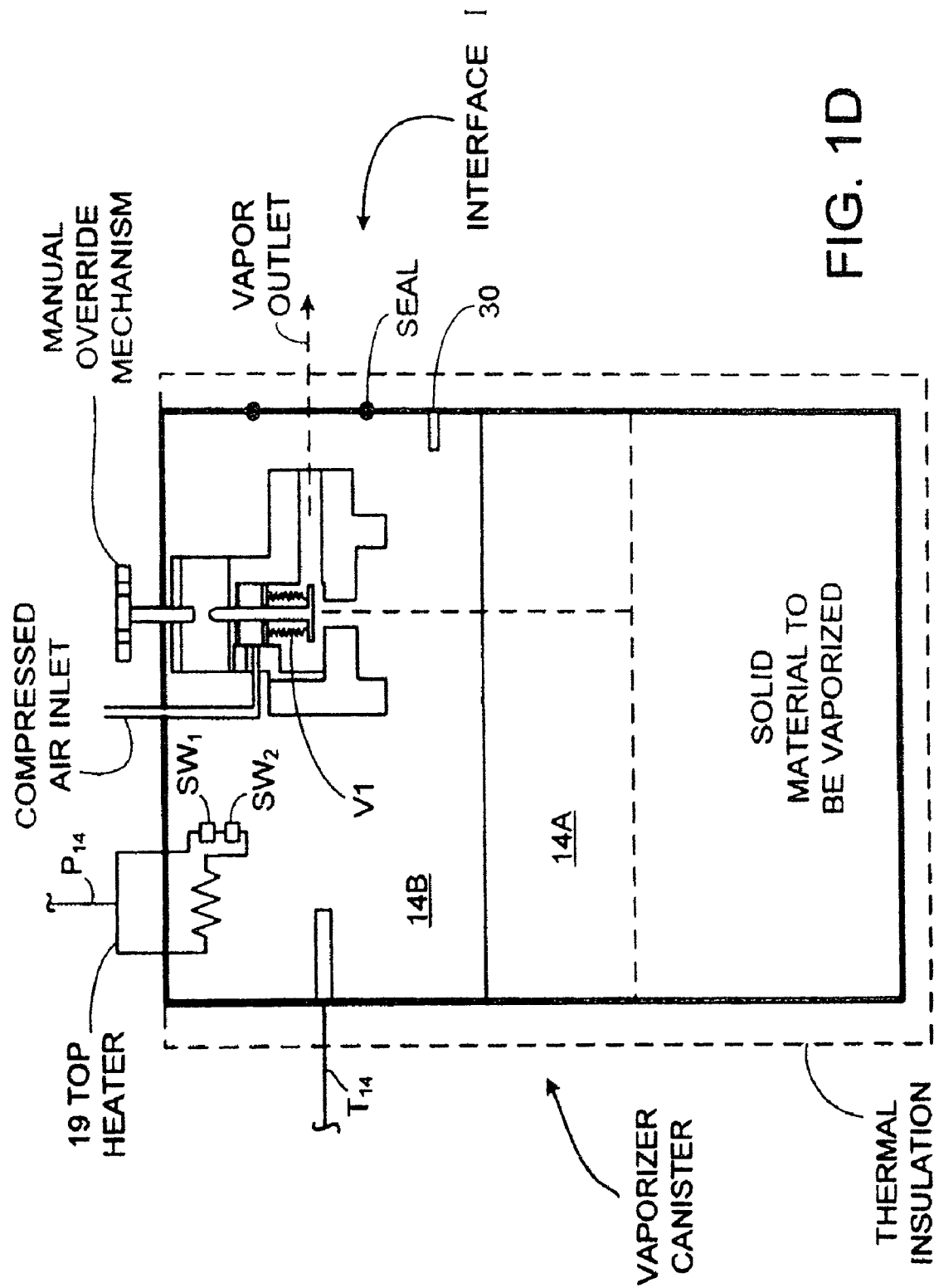
FIG. 1D is a schematic side view of a vaporizer useful in the system of FIG. 1.

Referring to FIG. 1D, in preferred implementations the vaporizer is a canister comprising a thermally-insulated canister body 14A as bottom section or member and a detachable top section or closure member 14B. Body 14A has a top opening and a volume, for instance, of 1 liter, for holding a charge of solid feed material that is to be progressively sublimated. Detachable top member 14B incorporates a valve V1. The top and bottom members, and preferably the valve as well, are comprised of thermally conductive material, for instance aluminum. The valve is located within the body 14B of the top member, by which it is maintained substantially at the temperature of the body.

Advantageously, only the top member of the vaporizer unit is electrically heated. Solid material within the canister body is heated to a major extent by heat transfer through the joint between the detachable top and bottom sections and through the side and bottom walls of the bottom section which are heated by conduction from the heater. In this manner it is ensured that the temperature $T_1$ of the vapor passage through the top member exceeds the temperature of the solid source material being sublimated.

As previously mentioned, placement of the heater in the detachable top closure section of a vaporizer-canister unit, whereas the charge of material to be vaporized at varying temperature is located in the bottom of the unit, might not appear to be good practice to those of ordinary skill. Thermal resistance of the interface between the detachable top and the bottom sections and the distance for the heat travel with associated thermal mass and slowness of response as well as heat loss to the exterior would appear undesirable. However, it is found that significant advantages are obtainable with this arrangement and what might seem to be inherent disadvantages are found avoidable or inconsequential in suitable implementations.

Thus the system ensures that vapors produced from the material encounter passages of increasing temperature while moving from the point of generation through valve V1 and to and through flow interface device 10. Similarly the part of the vapor-receiving device 22 that precedes the point of vapor utilization may define another heating zone adapted to be held at a temperature incrementally above that of the flow interface device 10.

Figure 2:
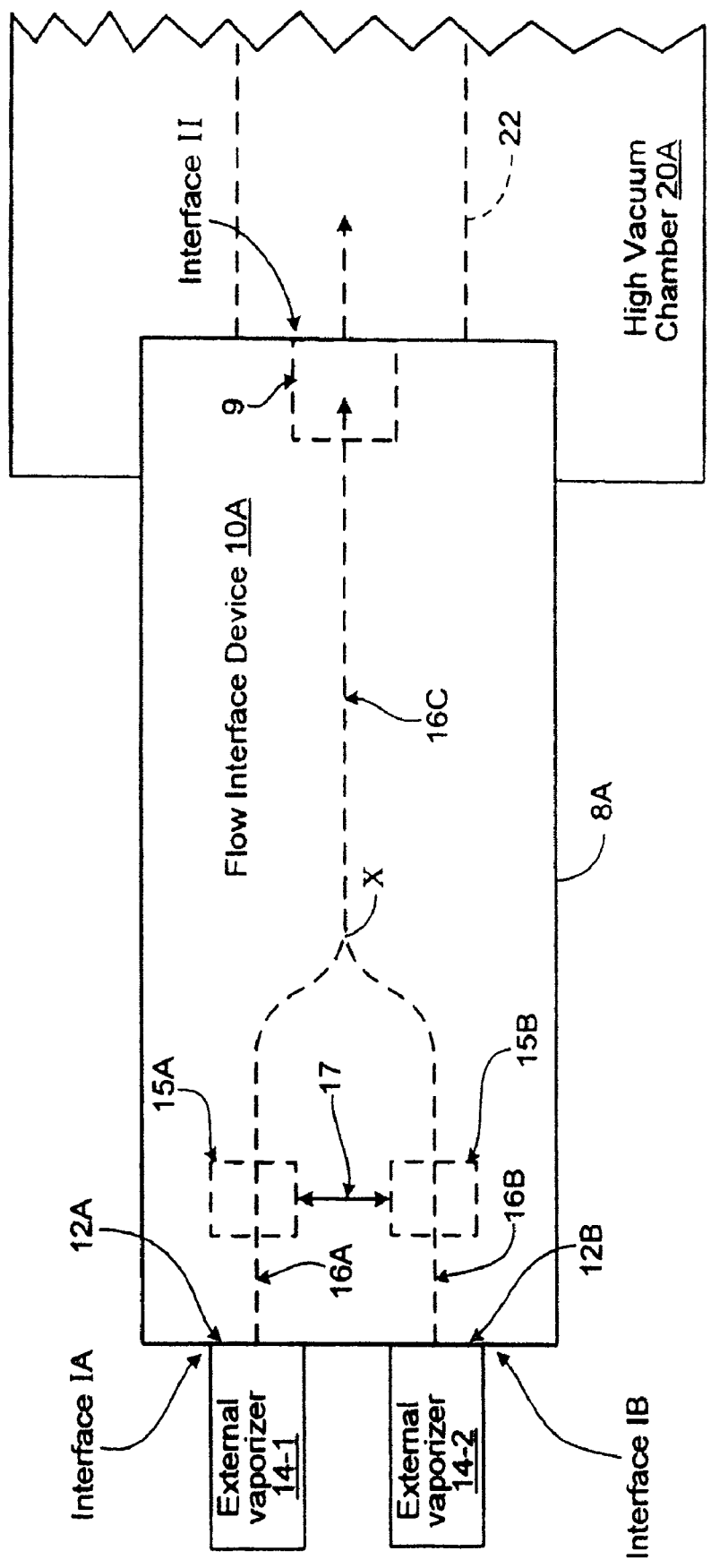
FIG. 2 is a schematic bottom plan view of an arrangement having a flow interface system similar to that of FIG. 1, which provides mounting stations for two vaporizers that supply vapor through a common vapor delivery path, and incorporates a valve system by which a desired vapor flow from each of two vaporizers can be selected.

Referring now to the plan view of FIG. 2, the flow interface system has all the features of the system of FIG. 1, some not shown, and also defines multiple vaporizer mounting stations. Two are shown, stations 12A and 12B.

Individual flow path segments 16A and 16B extend partially through the length of portion 8 of the thermally conductive body of device 10A, respectively, from the mounting stations 12A and 12B. Paths 16A and 16B merge at junction X. A common vapor flow path segment 16C extends through the remainder of portion 8A and through extension 9 of interface device 10A to interface II where the vapor is delivered to vapor-receiving device 22. Stop valves 15A and 15B in device 10 are associated with the individual flow paths 16A and 16B. As indicated by link 17, valves 15A and 15B are interlocked. This is done, in the case shown, in a manner that ensures each valve must be closed before the other can be opened. This prevents simultaneous flows from paths 16A and 16B.

The flow interface device 10A thus provides ready access for removal and servicing of two vaporizers without disturbance of the sealed connection 21 of interface device 10A with the high vacuum chamber 20; it permits one vaporizer to be serviced or filled, while another, containing the same source material, produces vapor and permits vaporizers of two different species to be installed for selective use. By providing, at Interface I, thermal isolation of the vaporizer-canister from the remainder of the system, an inactive unit is enabled to cool so that any charge of material remaining in the unit does not substantially degrade.

Figure 3:
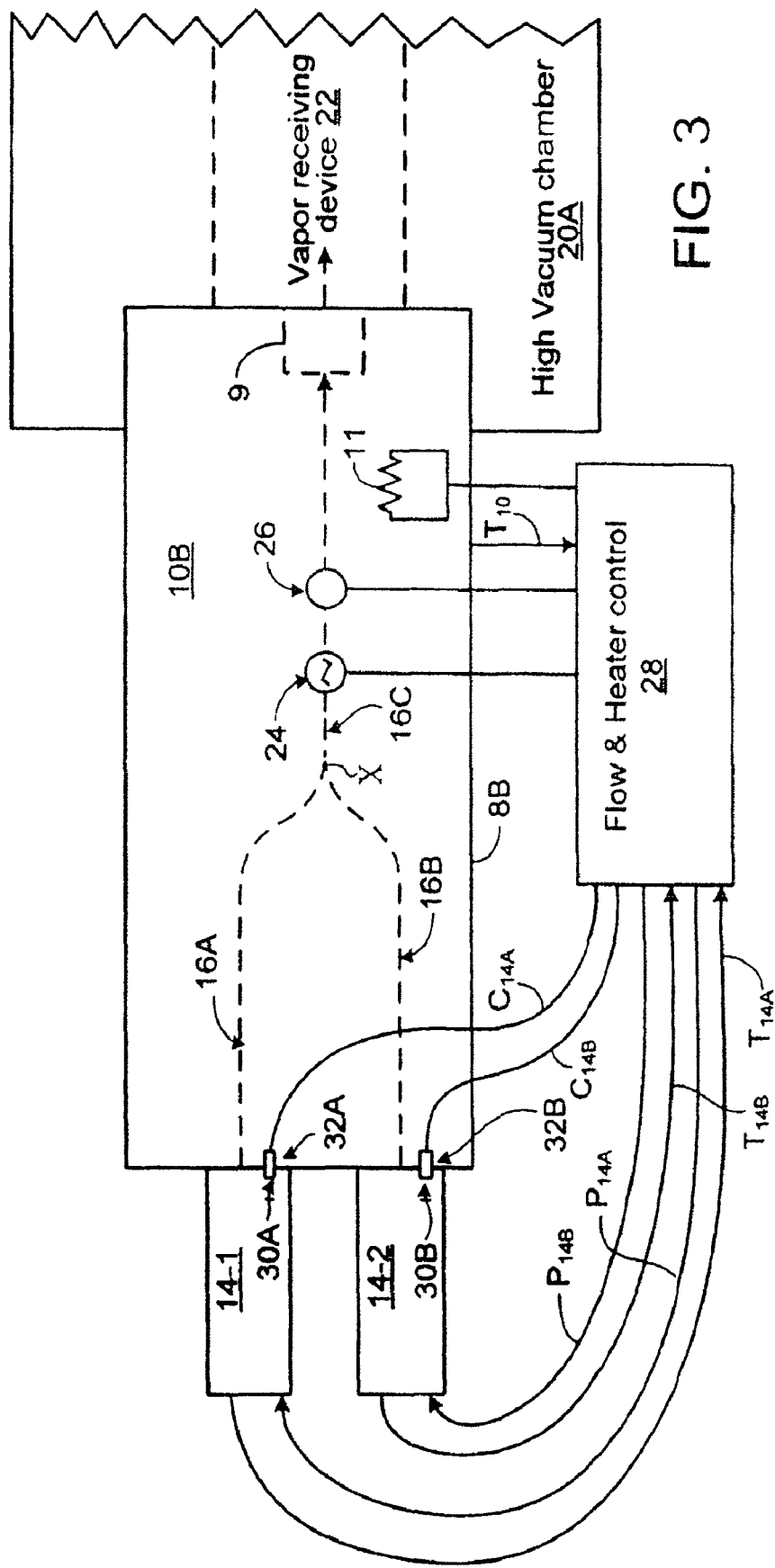
FIG. 3 is a schematic bottom view of an arrangement having a flow interface system similar to that of FIG. 2, and incorporating a flow control and vaporizer heating system by which a desired vapor flow from each of two vaporizers can be sustained.

Referring to FIG. 3, the flow interface system has all features of the system of FIG. 2, some not shown. Also, in common path 16C, the flow interface device 10B of FIG. 3 includes flow control device or throttle valve 24 followed by pressure monitor 26. These are connected to flow and heater control device 28 of the interface system. Control device 28 is connected to temperature sensing lines $T_{14A}$ and $T_{14B}$ and heater power lines $P_{14A}$ and $P_{14B}$ for the respective vaporizers 14A and 14B. Recognition devices 32A and 32B at the mounting stations interact with identity devices 30A and 30B on vaporizers 14A and 14B dedicated to particular source materials. The recognition devices communicate the identities of the types of vaporizers to the flow and heater control system 28, causing the latter to select proper operating limits, and application of appropriate power to the respective vaporizer heaters 19.

The flow control device 24 in common path C may comprise a throttle valve such as a butterfly valve that varies the vapor conductance of the passage. The control system may be constructed to operate in accordance with the protocol described in the patent application WO 2005/060602 published 7 Jul. 2005, entitled "Controlling the Flow of Vapors Sublimated from Solids", the entire contents of which are hereby incorporated by reference.

In particular, the operation of such a throttle valve to deliver a desired flow depends upon there being a desired pressure of vapor in the region immediately upstream of the throttle valve. It is to be noted that at a given vaporizer temperature, the amount of the vapor generated and hence its pressure, is dependent upon the amount of the charge of feed material that remains in position to be heated to vaporization temperature. To compensate for progressive depletion of the original charge of material, the control system senses delivered pressure and increases the temperature of the vaporizing chamber accordingly. It is advantageous for the vaporizer system to be capable of achieving the increased temperature without great delay. This is important during operation and is especially important during start-up when the operating pressure and heating system is being tuned to achieve desired performance of the overall system.

The single flow control device 24, being situated in the common path segment 16C, is capable of selectively controlling flows from two or more vaporizers at respective mounting stations. By interlocks, including the selected position of linked valves 15A and 15B as described in FIG. 2, the system may be prevented from heating and transmitting vapor from more than one vaporizer at a time. The selected vaporizer, device 10B and device 22 are constructed to be heated to the appropriate temperatures, e.g. $T_1<T_2<T_3$, where all of these temperatures are limited to a temperature $T_4$ below a safety limit for the particular material in the vaporizer selected. Thus, it is ensured that heating is applied in the pre-determined safe range appropriate for the material in the selected vaporizer, and that other conditions relevant to that material are properly controlled.

Figure 4:
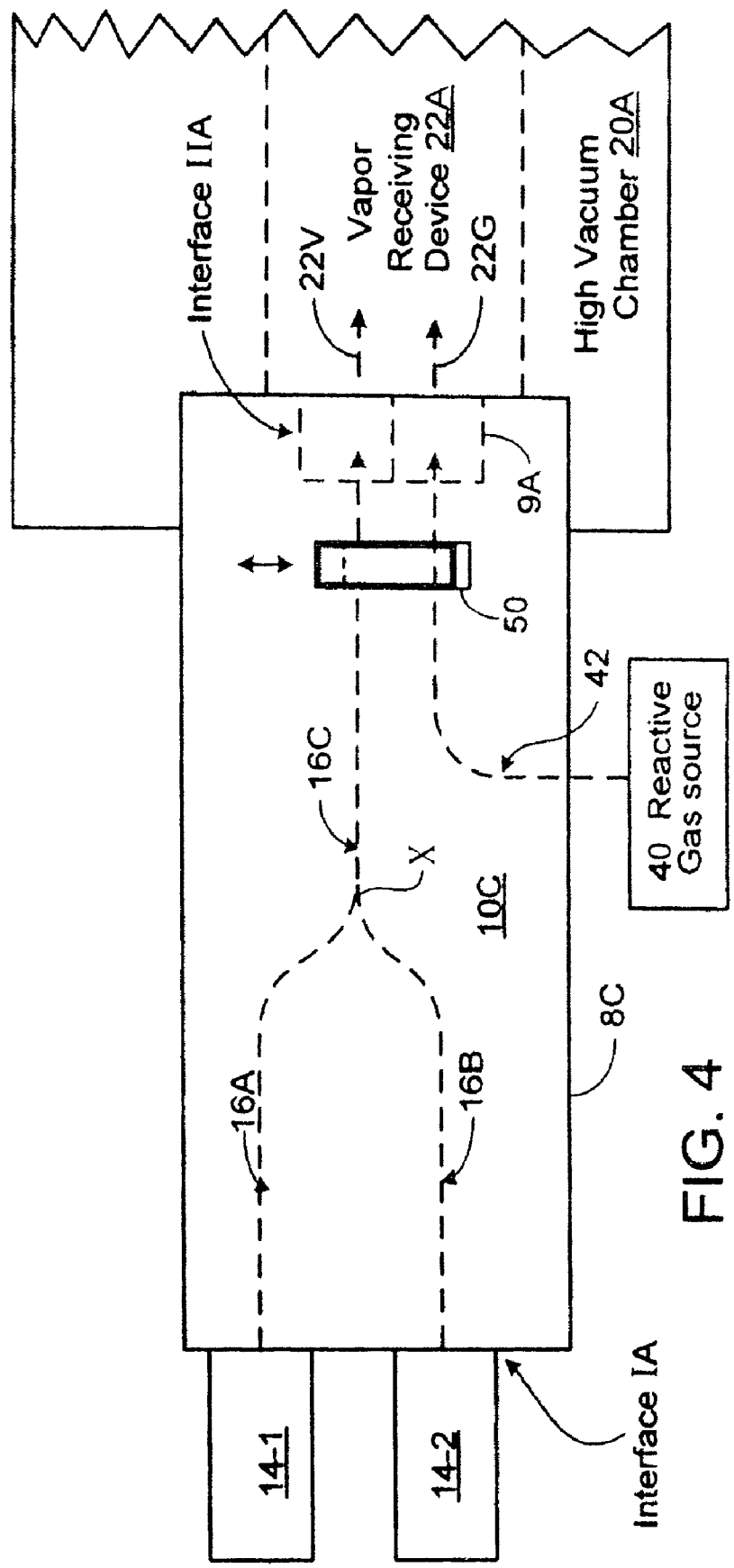
FIG. 4 is a schematic bottom view of an arrangement having a flow interface system similar to that of FIGS. 2 and 3 that incorporates a reactive gas source and a flow-stopping device that prevents co-communication of flows.

Referring to FIG. 4, a system is shown which may have all features of the system of FIG. 2 or 3, some not shown, and is provided with a reactive cleaning gas source 40 which communicates with passage 42 in portion 8C of the body of flow interface device 10C. An extension 9A of the flow interface device is sealed to a wall of the high vacuum chamber 20A and protrudes into the high vacuum chamber 20A to interface II-A. It defines two separate flow paths to the vapor receiving device 22A, path 16C for flow of vapor from the common vapor path and parallel but separate path 42 for flow of reactive cleaning gas. Sealed connection with corresponding passages 22V and 22G of the vapor-receiving device 22A are removably formed at interface II-A; each may be formed by labyrinth seals in the manner previously described. Leakage from either seal can be contained by the surrounding walls of high vacuum chamber 20A.

If implemented according to FIGS. 1A-1C, for instance, installation and removal movements of vapor-receiving device 22A along path A, can make and disconnect sealed connection of both vapor and reactive gas passages through extension 9A. Close-fitting surfaces of the matching parts can effectively form the labyrinth vacuum seals as previously described.

The reactive cleaning gas source 40 may be a container of reactive gas or a means for generating a reactive gas from a gaseous or solid feed material.

The interface device 10C of FIG. 4 includes a valve interlock 50 that prevents simultaneous flow of vapor and reactive cleaning gas to vapor receiving device 22A. In a preferred implementation, this is achieved with a reciprocal spool valve, which ensures that each path is completely closed before the other path is opened. In an alternative construction not shown, in which the reactive gas source 40 is a reactive gas generator that has a feed gas supply line for feed gas to be disassociated, the interlock can be formed with the feed supply line to the gas generator rather than with the reactive gas line, in a manner that can disable the supply line. In this case, the reactive gas connection with the vapor-receiving device may be separately formed.

Figure 5:
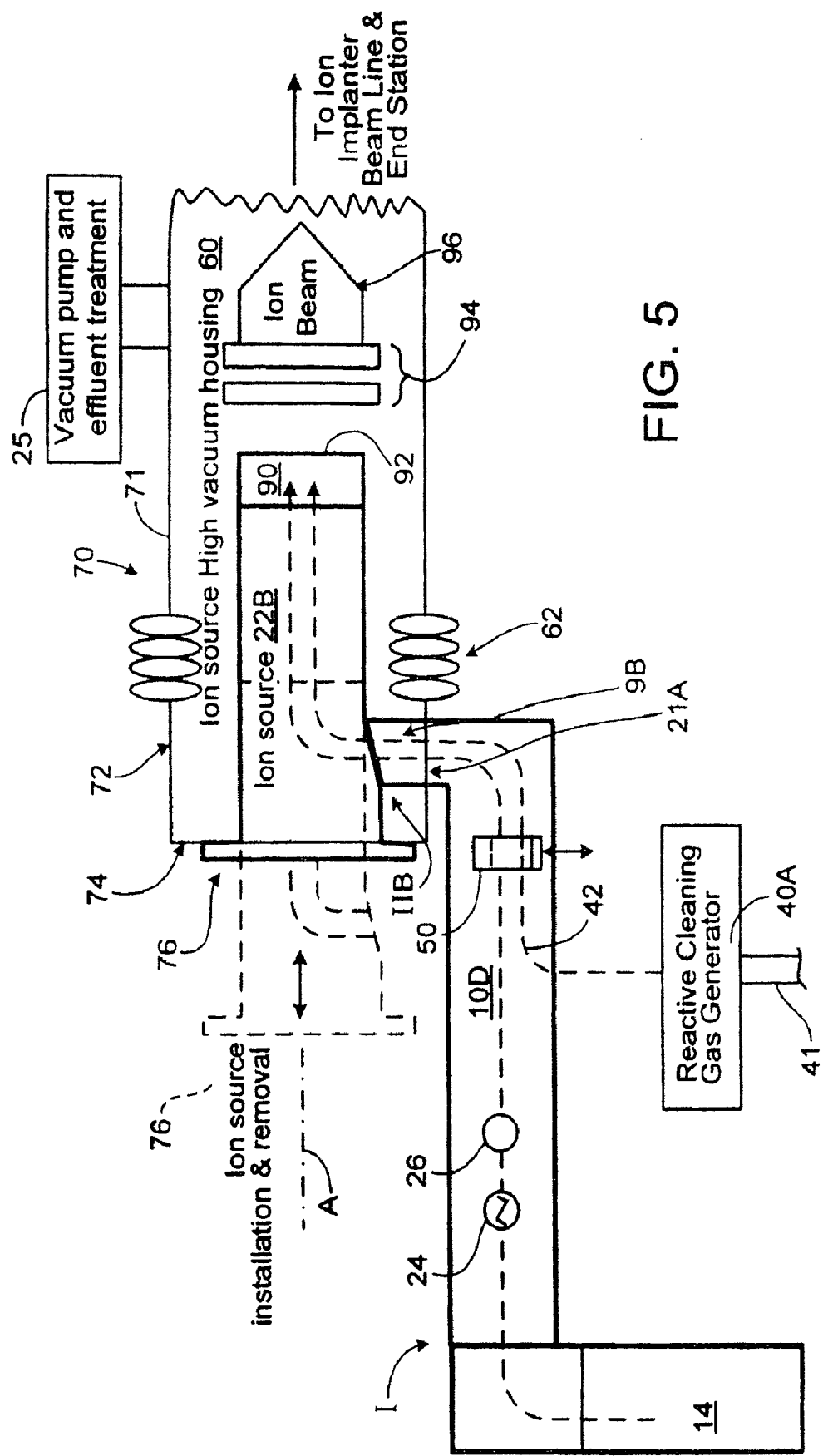
FIG. 5 is a schematic side view of an arrangement having a flow interface system similar to that of FIG. 1, shown integrated with an ion source within a high vacuum chamber, and having an external reactive cleaning gas generator and a flow-stopping device that prevents co-communication of flows.

Referring to FIG. 5, an adaptation of the general scheme of FIG. 1 is shown in which the vapor-receiving device comprises a high voltage ion source 22B, having an ionization chamber 90 into which a controlled flow of vapor is introduced to be ionized. Ions are withdrawn from ionization chamber 90 though an extraction aperture 92 by electrostatic attraction of an extraction electrode and final energy assembly 94 to form ion beam 96. The beam is directed along a beam line to an ion implanter end station, not shown. The high vacuum chamber of FIG. 5 comprises an ion source vacuum housing 70 that is provided with a high voltage insulator 62, for instance of reinforced epoxy. Insulator 62 electrically isolates the main vacuum housing member 71 from the high voltage end at which is mounted the ion source 22B and its vapor feed system 10D and 14. A vacuum-tight mounting ring 72 is provided on the high voltage side of insulator 62. It provides an end flange 74 for removably receiving and sealing with mounting flange 76 of ion source 22B. The ion source structure extends axially along axis A from the mounting flange into the vacuum chamber. As shown in FIGS. 4 and 5, the extension 9B of flow interface device 10D is of two-passage construction and is sealed at 21A to mounting ring 72. It protrudes into the high vacuum chamber to interface II-B. By constructing the interface for each passage of extension 9B according to FIGS. 1A-1C and FIG. 4, for instance, this interface can be positioned to receive the removable ion source via a connection that effectively form seals for each passage, for instance by close-fitting surfaces forming, effectively, labyrinth vacuum seals, in the manner previously described.

A reactive gas source in the specific form of a reactive cleaning gas generator 40A has a feed line 41 for a material, for instance a gaseous fluoride compound capable of being disassociated. The cleaning gas generator is constructed to provide disassociating conditions by which a reactive cleaning gas is generated, for instance, fluorine or fluorine ions. Its output is introduced to feed passage 42 in interface device 10D. As in FIG. 4, reactive gas passage 42 and the vapor flow path 16 pass through an interlock device 50, such as a spool valve, that selectively permits flow through only one passage at a time, preventing simultaneous flow. Advantageously a throttle valve 24 and pressure monitor 26 and associated controls, such as provided in FIG. 3, are provided in the flow interface device 10D. The reactive cleaning gas generator may comprise a plasma chamber or other apparatus capable of producing reactive gas cleaning from solid or gaseous feed material.

The system of FIG. 5 may readily be incorporated in each of the ion implanter systems shown in the published application WO 2005/05994 entitled "Method and Apparatus for Extending Equipment Uptime Ion Implantation," the contents of which, in this regard, are hereby incorporated by referenced as if fully set forth herein.

Figure 6:
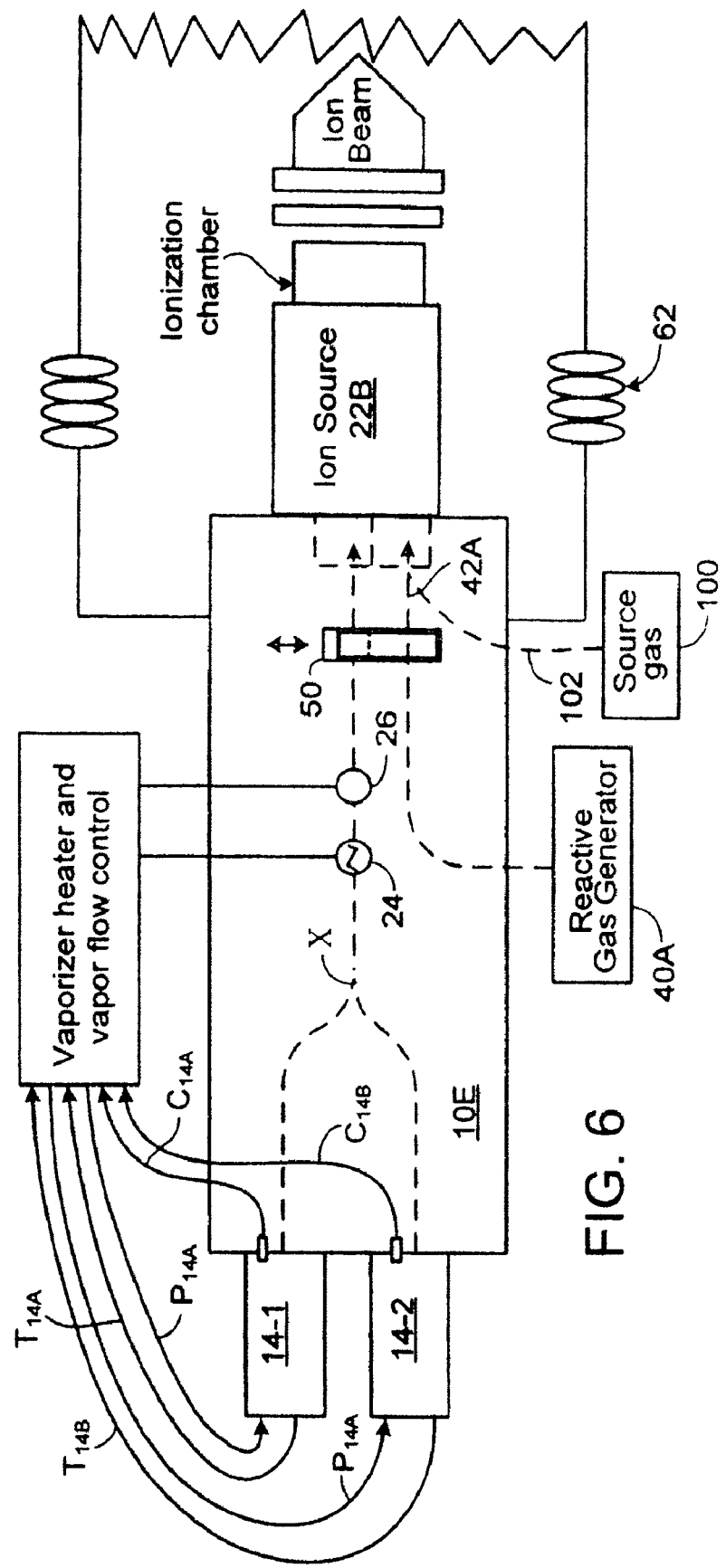
FIG. 6 is a schematic bottom plan view of an arrangement having an ion source system that has features of FIG. 5 combined with the flow control and dual vaporizer features of FIGS. 2, 3, and 4.

Referring to FIG. 6, an ion source 22B and vapor delivery system (14-1, 14-2, and 10E) similar to that of FIG. 5 may have all features of the systems of FIGS. 1-5, some not shown. In FIG. 6, two mounting stations are defined for solids vaporizers 14-1 and 14-2 for producing ionizable vapor. The system may have all interlocks and safety features so far described, and a control system constructed to control heating of the vaporizers and flow though the interface device 10E. A source of ionizable gas 100, such as gas of a monatomic doping species, is also provided having a conduit 102 associated with the interface system. It makes connection with the reactive gas passage 42A at a point downstream of the interlock 50. This downstream portion of gas passage 42A for reactive cleaning gas and the related reactive gas passage of extension 9A is thus alternately useful for introducing an ionizable material that is gaseous at room temperature for providing other dopant species. An interlock, not shown, may be provided to prevent flow of ionizable source gas when flow of ionizable vapor or cleaning gas is occurring.

Figure 6A:
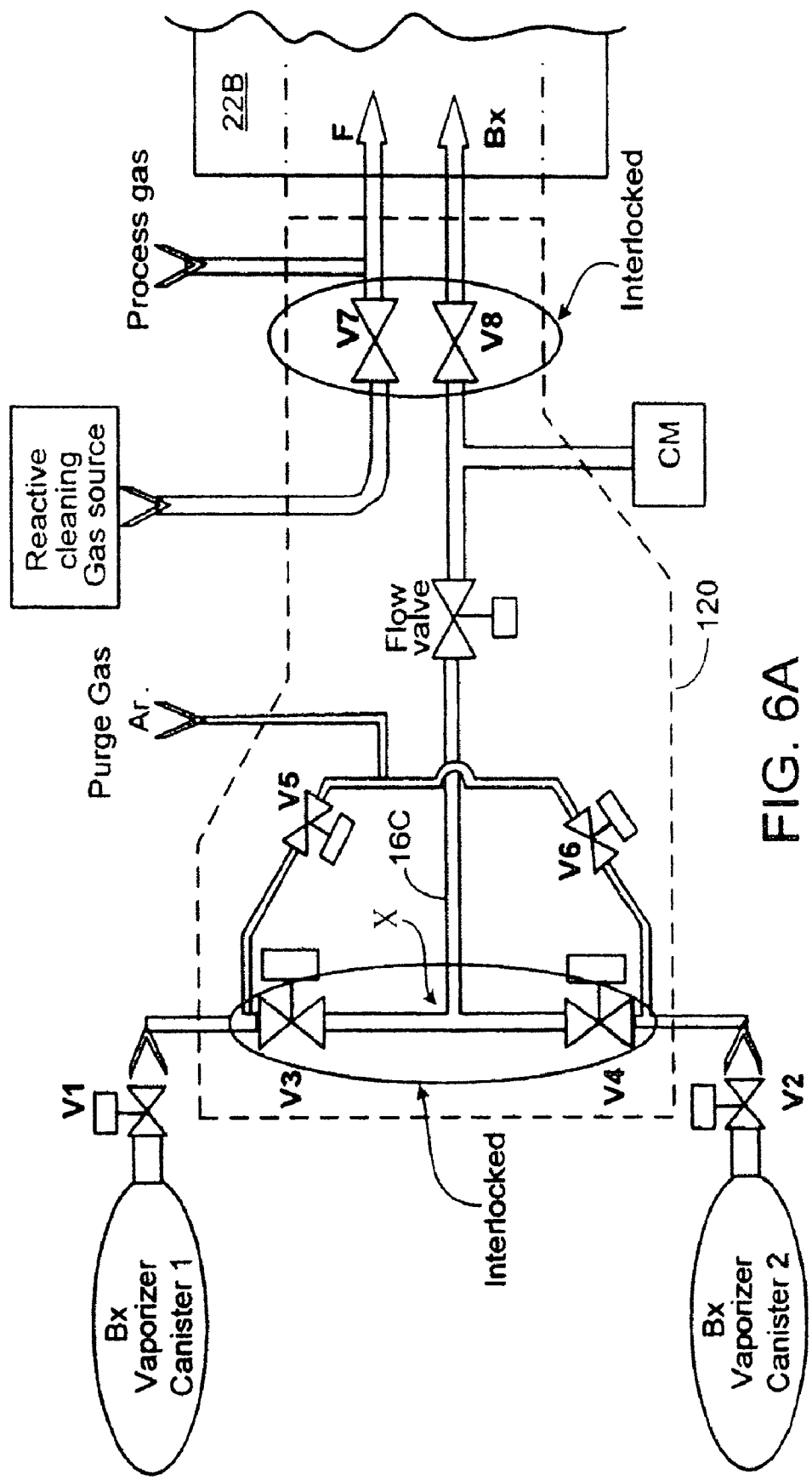
FIG. 6A is a valve and passage schematic drawing that implements features of FIG. 6 and includes a purge gas arrangement.

The schematic of FIG. 6A indicates that the flow features of FIG. 6 are incorporated in a conductive block 120. Also incorporated in the block are purge gas passages that enable purging the block e.g., with argon while the block is heated. This can remove vestiges of toxic or reactive vapor before servicing the system or before introducing vapor of another species. As indicated in FIG. 6A, this system in particular is suitable for providing boron-containing vapor $B_x$, e.g. decaborane and octadecaborane, from vaporizer bottles to an ion source 22B of an ion implanter.

The vapor system of FIG. 6A has a purge capability similar to techniques used for toxic gas boxes. The valve on the solids vaporizer canister, V1 or V2, is constructed to be remotely operated. It can thus be remotely closed to isolate the vaporizer. The interlocked vaporizer selector valves V3 and V4 (realized, for instance, in the form of a spool valve unit) also is operated to isolate the vapor delivery path from the vaporizer. A gas cavity is thus created between the bottle isolation valve and vaporizer selector valve. This gas cavity will contain residual vapor, e.g. $B_x$ vapor. Prior to vaporizer disconnection for removal, by appropriate actuation of valve V5 or V6, the cavity is cycle-purged with argon through common line 16C to eliminate any trace of $B_x$ vapor that otherwise might escape to the environment.

Figure 7:
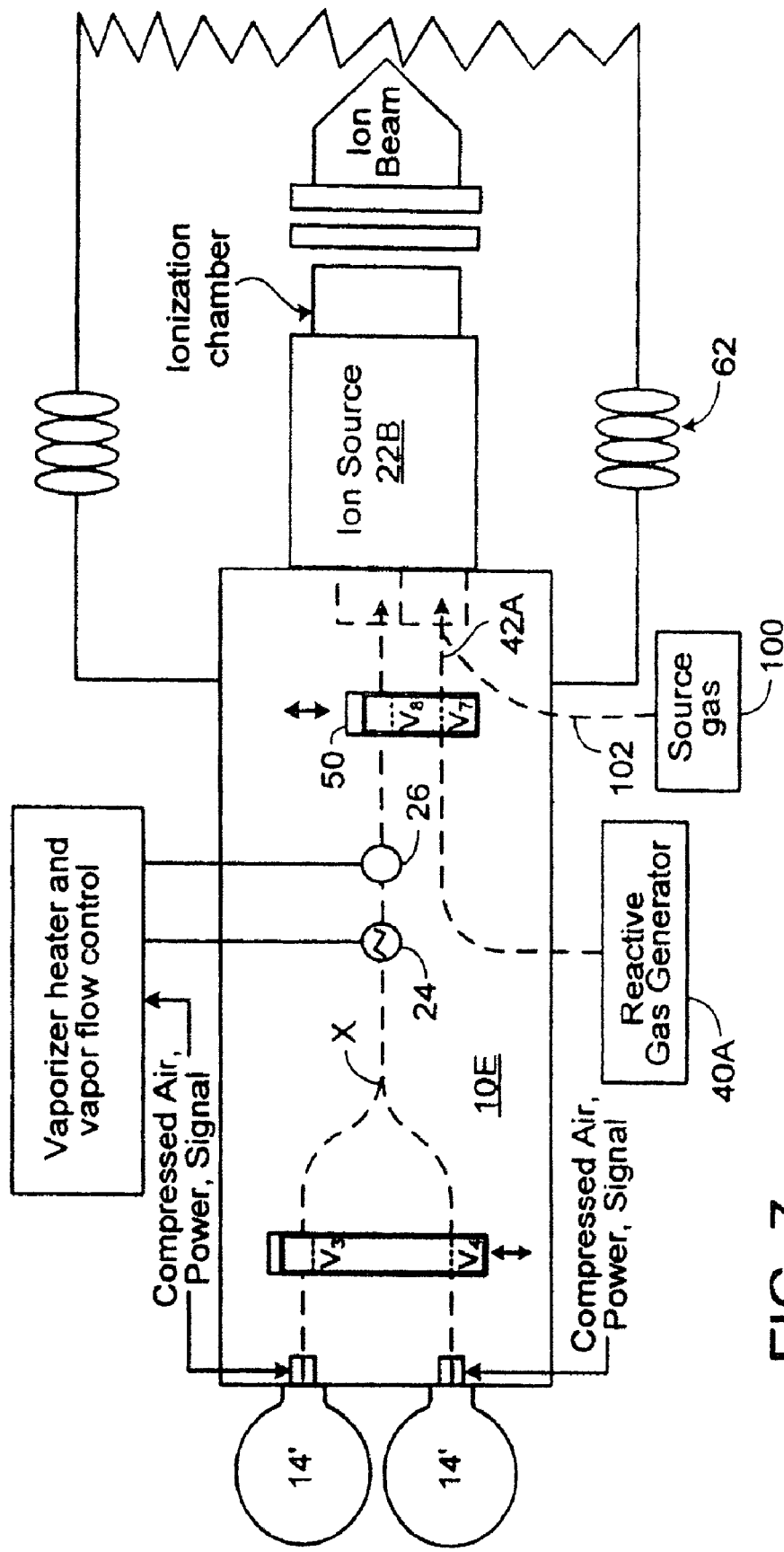
FIG. 7 is a view similar to FIG. 6, but showing installed two vaporizers and, schematically, spool-type valves that enable, in each instance, selection of only one flow path at a time.
Figure 7A:
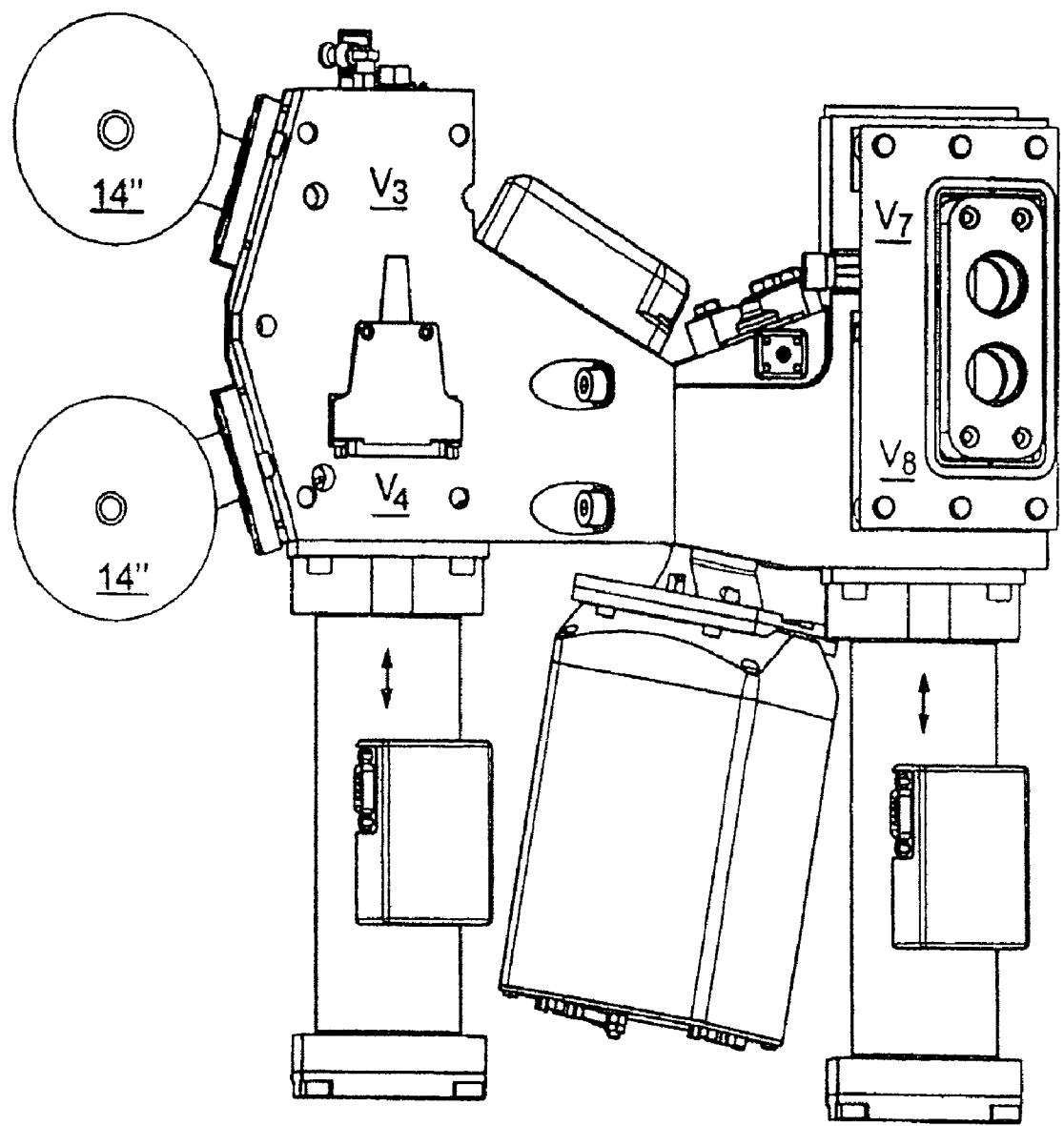
FIG. 7A is a top view and FIG. 7B a horizontal cross-section view of an implementation of the flow delivery system of FIG. 7.
Figure 7B:
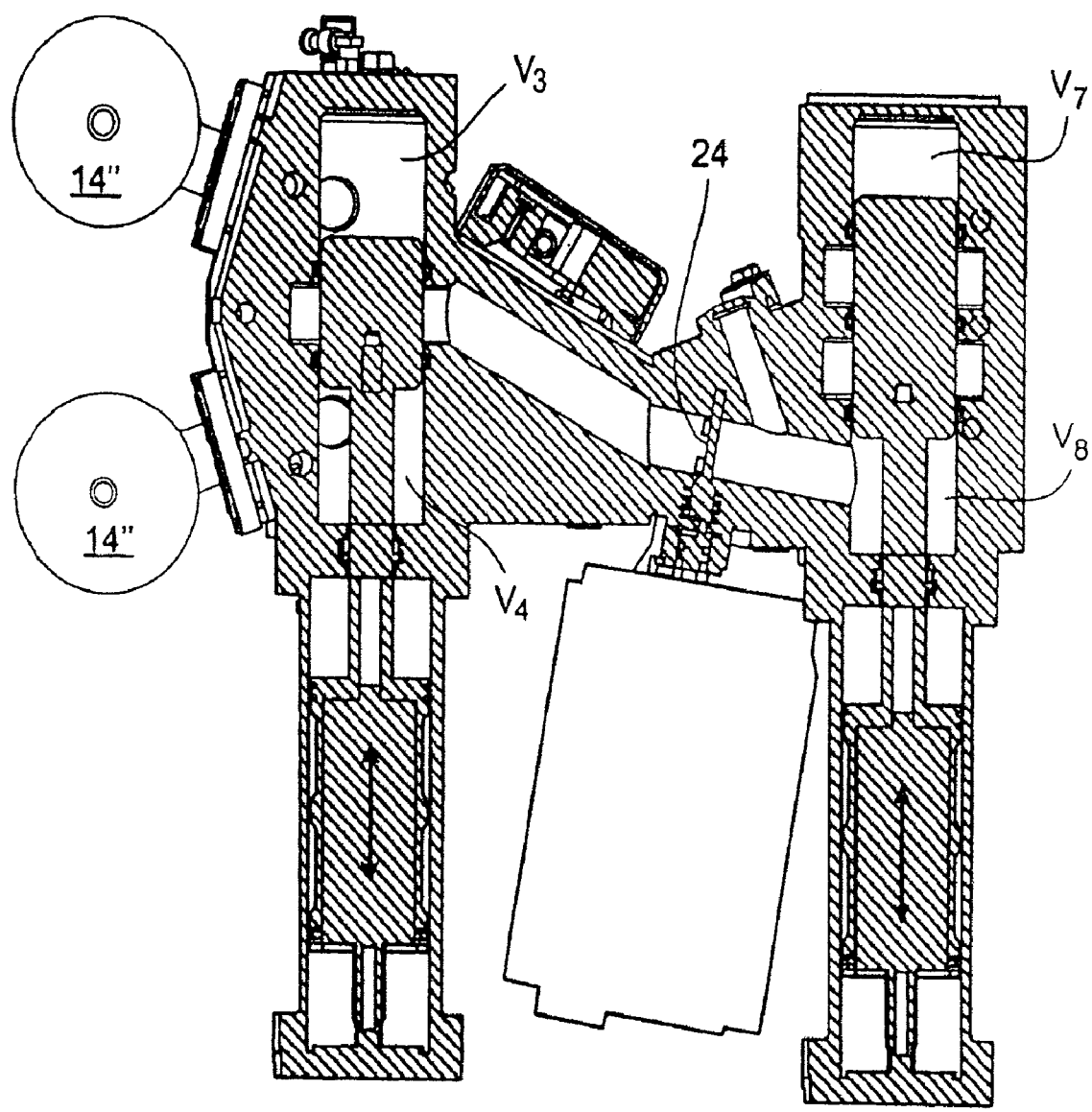

The system shown schematically in FIG. 7 and implemented in FIGS. 7A and 7B may be the same as that shown in FIG. 6 and has further features.

All connections to the canisters are formed at Interface I. This includes electrical power connections for powering the vaporizer heaters, signal connectors for signaling temperature and other parameters of vaporizer status and compressed air, for controlling the pneumatic valve within each vaporizer canister.

Like FIG. 6A, in FIGS. 7, 7A and 7B, interlocked valves V3 and V4 are provided for the vapor passages from the two vaporizers (vaporizers 14' in FIG. 7, vaporizers 14" in FIGS. 7A and 7B). The interlock is shown implemented by valve elements V3 and V4 being portions of a spool valve similar to the spool valve 50 of FIG. 6. The purge gas feature of FIG. 6A is included.

Figure 10:
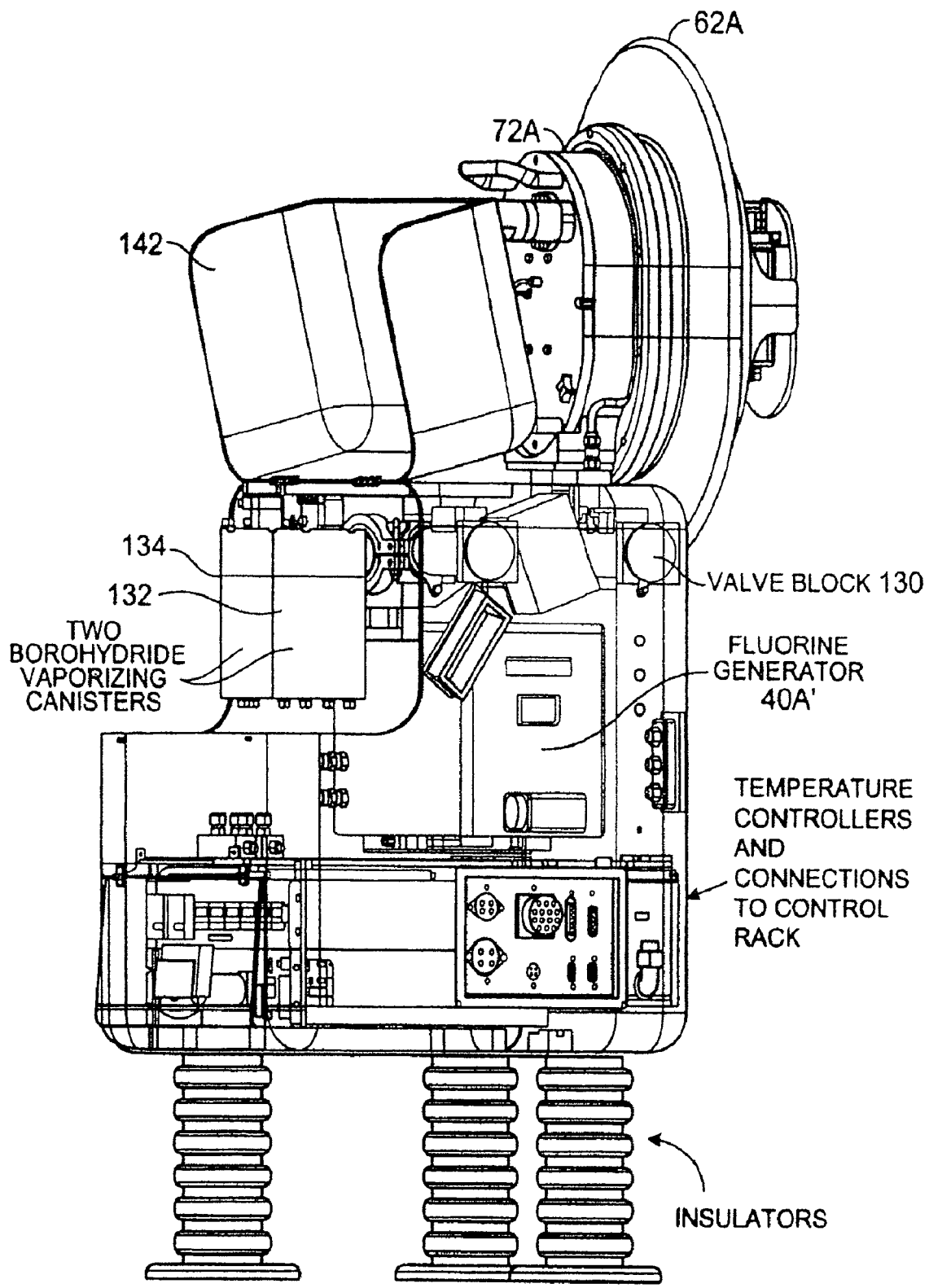
Figure 11:
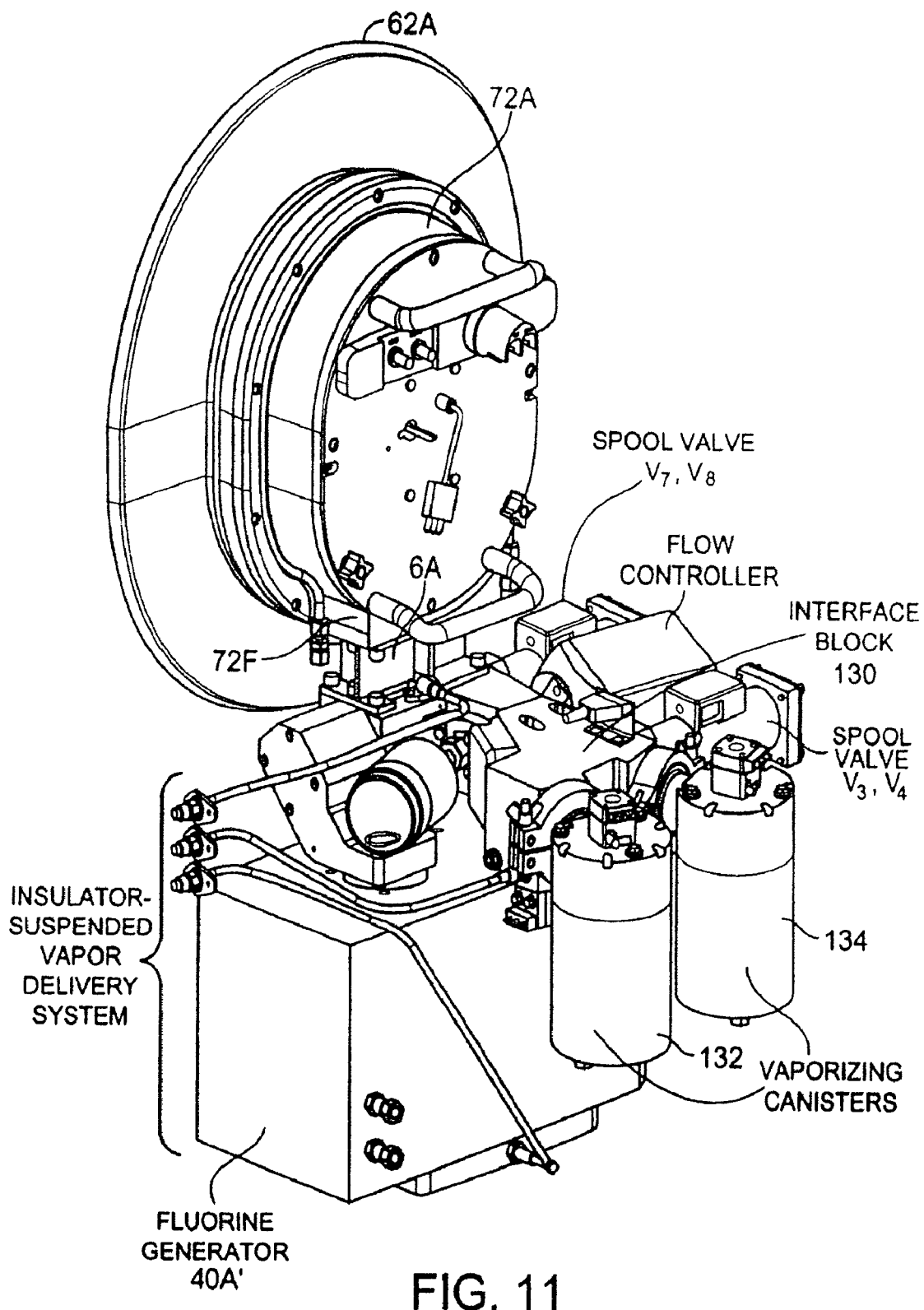
FIG. 11 is a perspective view of the system of FIG. 8 with cover removed.

FIGS. 8-11 show an implementation that combines all features of a flow interface device so-far described. As shown in FIGS. 10 and 11, a flow interface device, in the form of a thermally conductive body comprising a valve block 130, is mounted below the installation-and-removal path A of an ion source 22B, shown in FIGS. 8 and 9. Valve block 130 defines two mounting stations for vaporizers 132 and 134 of heated canister form, which hang from the flow interface device by mounting features incorporated in their top sections. Valve block 130 has individual flow passage segments from these mounting stations, that merge to a common passage segment that leads into the high vacuum chamber 71A, FIGS. 8 and 8B.

Figure 8:
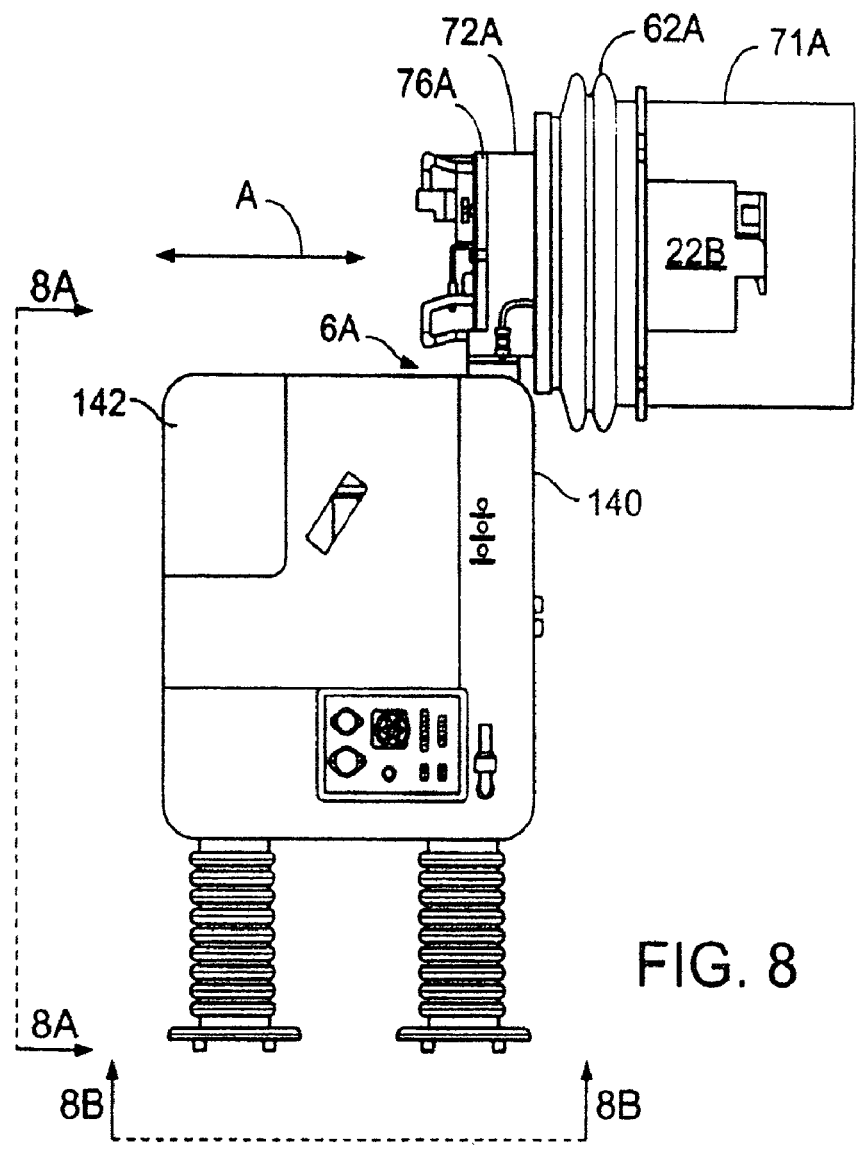
FIGS. 8, 8A and 8B are orthogonal views of an implementation of a vapor delivery system within a housing, showing its relationship to an ion source high vacuum housing and ion source.
Figure 8B:
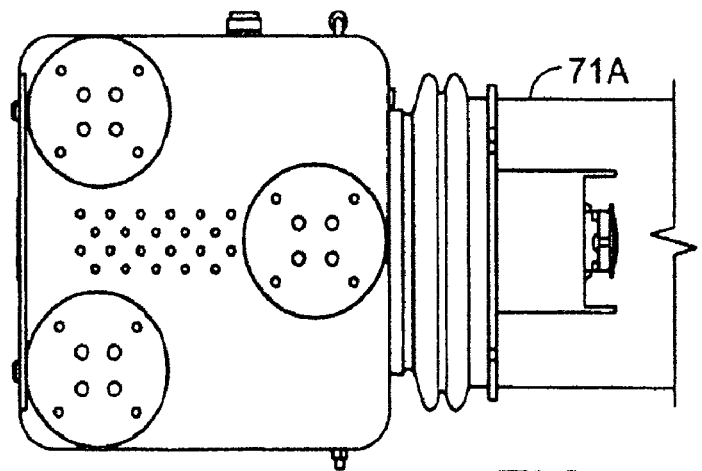
Figure 8A:
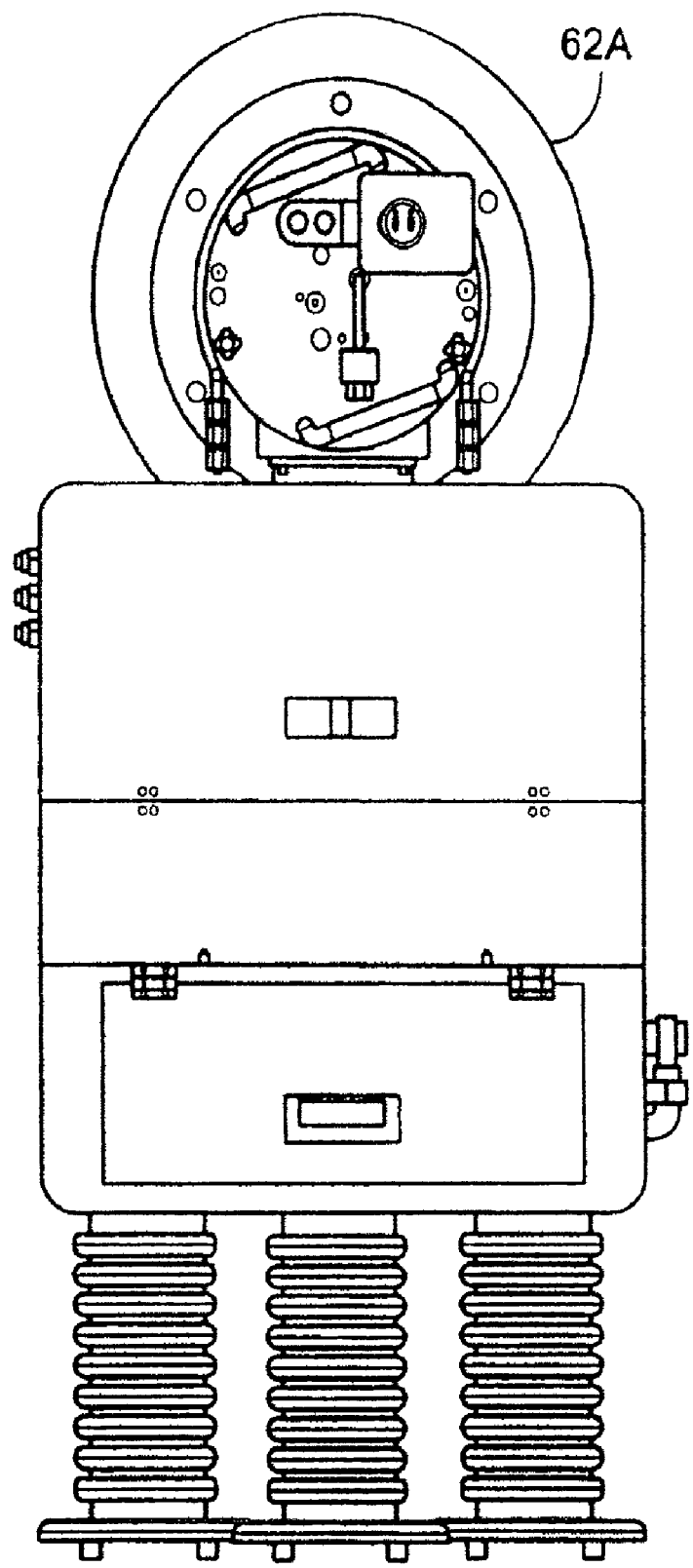
Figure 9A:
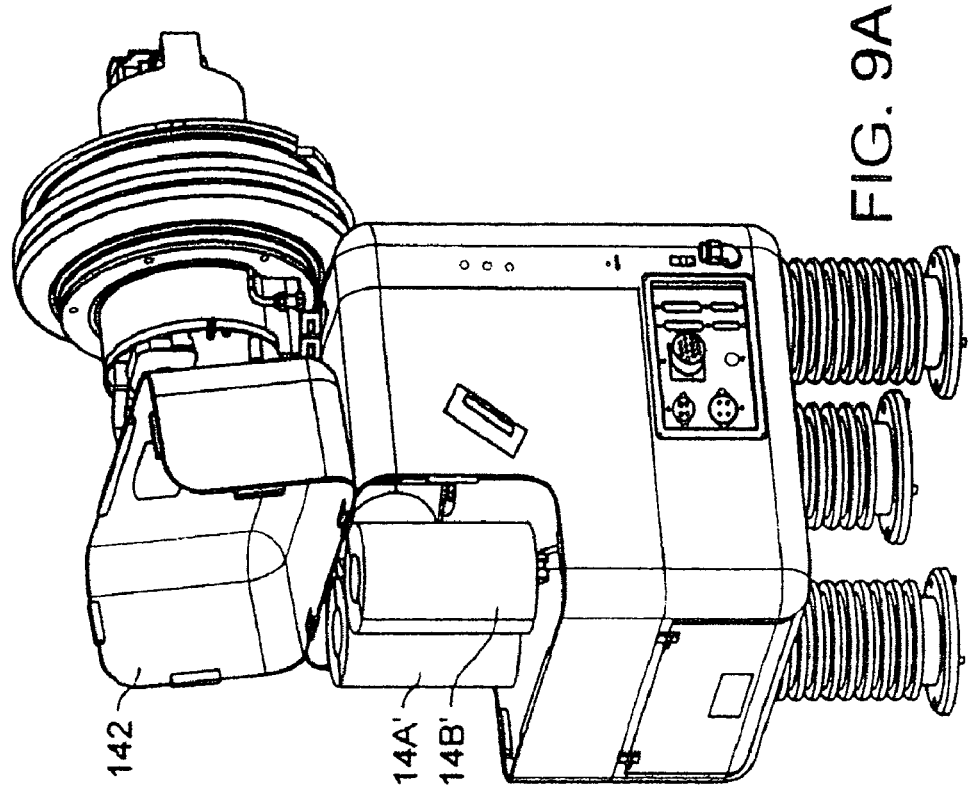
FIGS. 9, 9A and 10 are perspective views of the system of FIG. 8 illustrating the opening of a cover to access two vaporizers installed in the system.
Figure 9:
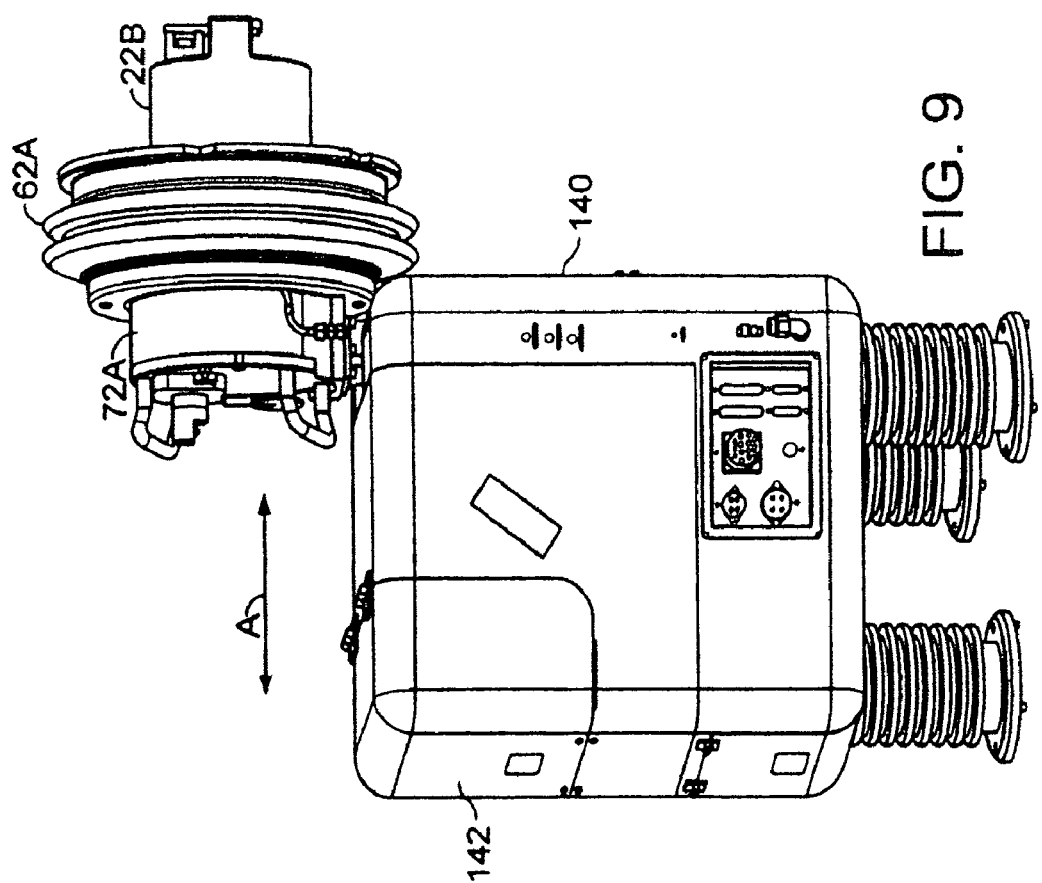

As shown in FIGS. 8 and 11, and similar to features shown in FIGS. 1A-1C, the interface device 130 is suspended, by its collar 6A, from a mounting flange 72F that forms part of vacuum housing mounting ring 72A. Thus the system is suspended on the high voltage side of high voltage insulator 62A. Its flow passages connect to the ion source structure via a cammed connector within the vacuum housing as shown in FIGS. 1A-1C. A reactive cleaning gas source, in the form of a plasma chamber 40A', is suspended from the valve block 130, below it. It is constructed to disassociate a feed gas to produce reactive fluorine. In one preferred form, the weight of this entire assembly is carried by ion source mounting ring 72A, which in turn is supported by insulator 62A.

Incorporated in the valve block 130 are cartridge heaters and valves that perform the safety and flow heating and control functions of the heater and valves described with respect to the previous figures. A sheet metal enclosure 140 surrounds this delivery assembly, and has covers, including vaporizer cover 142, that can be opened for access. This enclosure is supported from the floor by feet comprising high voltage insulators. Thus the entire vapor delivery system is adapted to be maintained at the high voltage potential of the ion source.

It will be understood that numerous other physical arrangements are possible that still provide the actions described at one or the other sides of a mounting ring connected to the insulator and still out of the path of installation and removal of the ion source.

Referring to FIG. 11, vaporizer units 132 and 134 are shown. Each has a heater, as in FIG. 1D and is constructed to contain and heat a solid feed material such as decaborane or oroctadecaborane to a temperature that produces vapor to be ionized. As with the unit of FIG. 1D, the vaporizer unit comprises a lower canister body 14A having a solids-receiving volume, typically about a liter, and a detachable top closure member 14B. It is constructed to hang vertically from the top closure member at a suitable mounting station. For this purpose, the top closure member defines a vertical mounting surface to match and seal with a corresponding surface of the mounting station defined by the flow interface device 10, FIG. 1, or its valve block implementation. Top member 14B of the canister of FIGS. 1D and 11 also incorporates a valve V1 that permits vapor flow from the canister to the mounting station. Top member 14B is formed of thermally conductive material, e.g. aluminum.

The heater 19 of this vaporizer preferably comprises a set of cartridge heater elements fit into receptacles formed in the top member 14B. Importantly, this heater, located in the detachable top member is found to provide sufficient heat to vaporize the solids properly. By its location, it serves to maintain the valve of the top closure member at temperature higher than the temperature to which the solid material is heated. Advantageously, for this purpose, the body of valve V1 is comprised of thermally conductive aluminum and disposed in conductive heat transfer relationship with the heater, via the aluminum top member to maintain the vapor passage through the valve substantially at heater temperature.

In preferred implementations, there is only one controlled heating zone for the vaporizer. With these features in combination, it is found that the heater located in the top section of the vaporizer-canister can produce efficient vaporization of the remote charge in the lower section as the charge is consumed. The construction is found to have a sufficiently low thermal mass so that acceptably fast equilibration to a set temperature can occur. This permits proper operation and sufficiently rapid change in temperature setting as an operator adjusts parameters to initiate or tune the operation of the overall system.

In particular, the unit is found useful with pressure-based throttle valve vapor flow control 24, implemented e.g. with a butterfly valve, in which the vaporization temperature must be gradually increased as the charge of feed material is consumed to maintain the pressure upstream of the throttle valve, see FIGS. 3, 6, and 7 and related description.

Furthermore, and very importantly, the positive temperature gradient from bottom to top of the vaporizer unit that is attainable with this heat transfer arrangement prevents condensation of the vapor and build-up of disadvantageous deposits in the vapor valve V1 (located at the transition from vertical to horizontal flow) and the vapor delivery passage (upward inlet passage and horizontal delivery passage). These features are strategically located close to the heater, with temperature dependably being higher than the temperature of the charge of material in the bottom of the remote vaporization cavity.

In more detail, the rising passage terminates at a horizontal valve seat. The horizontal vapor passage then extends from the valve. Top part 14B houses pneumatic bellows valve (V1 in FIG. 1D, V1 or V2 in FIG. 6A) and a portion of the "open permissive" mechanism referred to "Mechanical override mechanism" in FIG. 1D.

Cartridge heaters of suitable type may be employed in the top section 14B of the vaporizer and in the valve block flow interface device 10.

Suitable RTDs (resistive thermal detectors) are located at the bottom of the vaporizer-canister unit and elsewhere in the system. A conductive lead for signal from the bottom sensor extends to a connector at the interface with the top section 14B. This connector is laterally aligned with a mating connector of the top section by bringing the overall mounting devices of the unit into alignment with those of the bottom section, and movement of the aligned top section down to engage the bottom section engages the connector.

The top of the regulated temperature range for the RTD temperature sensor, controlled by the remote thermal control unit, in one example, may be set at 40 C for $B_{10}H_{14}$ and 120 C for $B_{18}H_{22}$, and, for one example, an over-temperature limit switch in the top of the vaporizer-canister unit may be set at 50 C for a $B_{10}H_{14}$ vaporizer-canister and 140 C for a $B_{18}H_{22}$ vaporizer-canister. Similar temperature settings are employed with other feed materials, the particular values being dependent upon the vaporizing properties of the chosen material As previously indicated, separate thermal zones are established to prevent heat migration between the vaporizer canister and the vapor-receiving device, accomplished by introduction of a substantial thermal break. This prevents heat entering the vaporizer unit from the vapor-receiving device and interfering with the thermal control system of the vaporizer-canister unit. Also, because of presence of this thermal break, a mounted vaporizer-canister unit can cool relatively quickly after being de-energized and its outer thermal insulation removed, despite the vapor-receiving device to which it is mounted being hot and continuing operation at temperature with another attached vaporizer unit. Despite continued heated state of the flow interface device (valve block), workmen can soon handle a de-energized vaporizer-canister unit for removal and replacement. Alternatively, the cooled unit may be left in place while avoiding substantial thermal degradation of remaining charge of feed material that otherwise would occur due to heat from the interface device.

The system described is suitable for safe production of ion beams from large molecule feed materials, including boron containing compounds such as decaborane ($B_{10}H_{14}$) and octadecaborane ($B_{18}H_{22}$).

As described, the system of FIG. 7 has two sources of gas delivery, gas from the reactive cleaning gas source and vapor from the vapor delivery system. The isolation valves V7 and V8 that deliver $NF_3/F$ and $B_x$ to the ion source are mechanically linked (realized, for instance by a spool valve unit) such that these two streams are never allowed to be cross-connected.

A number of implementations of the inventive aspects have been described. Nevertheless, it will be understood that various modifications may be made without departing from the spirit and scope of the invention. Accordingly, other implementations are within the scope of the following claims.

The invention claimed is:

1. A vapor delivery system comprising a high vacuum chamber, a vapor-receiving device removably installed within the high vacuum chamber and a flow interface device that defines a vapor flow path, the flow interface device comprising a flow-path-defining portion located outside of the vacuum chamber and a flow-path-defining delivery extension that protrudes from the outside into the high vacuum chamber, the delivery extension having an exterior, the exterior sealed to a wall of the high vacuum chamber, the part of the flow path outside of the high vacuum chamber constructed to convey vapor from a vapor source to the delivery extension, and a disengageable flow connection within the high vacuum chamber between the delivery extension and an inlet passage associated with the removable vapor-receiving device, the system enabling any leakage at the connection to enter the vacuum within the vacuum chamber.

2. The vapor delivery system of claim 1 in which the vapor-receiving device has a path for removal and installation that is generally horizontal and the flow interface device is mounted at a level below that path in position not to interfere with removal and installation motions of the vapor-receiving device.

3. The vapor delivery system of claim 2 in which the delivery extension protrudes generally upwardly into the high vacuum chamber.

4. The vapor delivery system of claim 1 in which the vapor-receiving device within the high vacuum chamber is a high voltage ion source and the interface device is constructed to conduct ionizable vapor to it.

5. The vapor delivery system of claim 4 in which the ion source is mounted within the vacuum chamber via an electrically insulating bushing, the flow interface device being located electrically on the ion source side of the insulating bushing and out of a path of removal of the ion source, in manner enabling removal of the ion source without interference by the flow interface device.

6. The vapor delivery system of claim 5 in which the flow interface device is supported by a mounting structure that is connected to the electrically insulating bushing.

7. The vapor delivery system of claim 6 in which the mounting structure is a mounting ring to which the ion source is mounted.

8. The vapor delivery system of claim 6 in which a source of reactive gas in the form of a disassociating device is supported by at least indirectly via the mounting structure out of the path of removal of the ion source.

9. The vapor delivery system of claim 8 in which the disassociating device is suspended from the flow interface device which in turn is suspended from the mounting structure.

10. The vapor delivery system of claim 6 in which the flow interface device defines, at a vapor-inlet port connected to the vapor path, a station for removably mounting a heated vaporizer for vaporizing solid material, whereby the vaporizer is supported by the flow interface device which in turn is suspended from the mounting structure.

11. The vapor delivery system of claim 10 in which the flow interface device has vapor inlet ports at mounting stations for removably mounting at least two heated vaporizers for vaporizing solid materials and a valve system enables flow from a selected vaporizer through the flow path.

12. The vapor delivery system of claim 11 in which separate vapor inlet paths of the flow interface device dedicated to respective vaporizers merge into a common vapor delivery path, a common throttle valve for control of vapor flow is located along the common passage, and a control system is provided for controlling the throttle valve.

13. The vapor delivery system of claim 1 in which the portion of the interface device outside of the vacuum chamber comprises a thermally conductive body which defines a part of the vapor path, the conductive body being associated with an electric heater.

14. The vapor delivery system of claim 1 in which the portion of the interface device outside of the vacuum chamber defines at least two vapor-receiving interfaces at each of which is defined a mounting station for a heated vaporizer, the interface device having passages for delivering vapor from each of the vaporizers to the vapor-receiving device via the delivery extension.

15. The vapor delivery system of claim 14 in which the interface device includes a valve system constructed to enable selection of flow from the vaporizers.

16. The vapor delivery system of claim 1 for use with a vaporizer constructed to generate vapor at pressure exceeding the pressure of the desired flow to the vapor-receiving device and a throttle valve is included in the flow path of the flow interface device to regulate flow to the vapor-receiving device through the delivery extension.

17. The vapor delivery system of claim 1 in which the vapor-receiving device is capable of being installed and removed with respect to the vacuum chamber by opposite movements along a path and a terminal portion of the delivery extension of the flow interface device is disposed within the vacuum chamber in position to be engaged and disengaged by structure of the vapor-receiving device during its respective installation and removal movements along its path.

18. The vapor delivery system of claim 17 in which the terminal portion of the delivery extension comprises a spring-loaded cam member adapted to be displaced by movement of the vapor-receiving device to form a seal with a surface of the vapor-receiving device.

19. The vapor delivery system of claim 1 in which the vapor receiving device is an ion source, the flow interface device is associated with a source of reactive cleaning gas, and a vapor passage extending through a portion of the delivery projection to the ion source is adapted, when the ion source is energized, to deliver solids-derived vapor from a vaporizer for ionization, and a portion of the delivery projection defines a passage enabling flow of reactive cleaning gas from the source of reactive cleaning gas to the ion source when the ion source is de-energized.

20. The vapor delivery system of claim 19 in which the reactive gas source is a device for disassociating a flow of precursor gas or vapor to produce a flow of reactive gas.

21. The vapor delivery system of claim 20 in which the disassociating device is a supplemental plasma chamber constructed to disassociate a flow of precursor gas or vapor to produce the flow of reactive gas.

22. The vapor delivery system of claim 19 in which the vapor path is provided within a thermally conductive body which defines a mounting station for removably receiving and communicating with a vaporizer, there being a heating system adapted to heat the conductive body.

23. The vapor delivery system of claim 22 in which the flow interface device has vapor inlet ports at mounting stations for at least two vaporizers.

24. The vapor delivery system of claim 23 combined with a set of vaporizers in which one vaporizer in the set is dedicated to decaborane and another to octadecaborane.

25. An ion implanter ion source system including an ion implantation ion source located within a high vacuum housing combined with a vapor delivery system comprising: at least one vaporizer constructed to heat a solid feed material to its vaporization temperature to produce vapor to be ionized and a vapor passage extending to the ion source from a receiving port for vapor from the vaporizer, the vapor passage arranged to deliver solids-derived vapor from the vaporizer for ionization, the ion source mounted within the vacuum housing via an electrically insulating bushing and mounting structure connected to the bushing, the ion source being removable from the bushing and housing, the vapor delivery system being located electrically on the ion source side of the insulating bushing and being supported by the ion source mounting structure out of a path of removal of the ion source, in manner enabling removal of the ion source without interference by the vapor delivery system.

26. The ion implanter ion source system of claim 25 in which a source of reactive cleaning gas associated with the ion source is also supported at least indirectly by the mounting structure out of the path of removal of the ion source.

27. The ion implanter ion source system of claim 26 in which a delivery extension from the vapor passage extends into the evacuated space of the vacuum housing in position to be engaged and disengaged by ion source structure at an engagement region exposed to high vacuum, whereby leak of toxic vapor at the region of engagement presents no hazard to workmen.

28. The ion implanter ion source system of claim 25 in which the vaporizer is constructed to generate vapor at pressure exceeding the pressure of the desired flow to the ion source, a throttle valve is included in the vapor passage to regulate the flow to the ion source, the vapor passage, including the throttle valve, being provided within a thermally conductive body, there being a heating system adapted to maintain the conductive body at temperature above that of the vaporizer producing the vapor, the conductive body being suspended from the mounting structure.

29. The ion implanter ion source system of claim 28 in which the conductive body defines vapor inlet ports at mounting stations for at least two vaporizers, and within the conductive body there being flow passages from the respective inlets and a valve system enables selection of flow from a vaporizer.

30. The ion implanter ion source system of claim 29 in which separate vapor inlet passages dedicated to respective vaporizers merge into a common vapor delivery passage, the throttle valve for control of vapor flow is located along the common passage, and a control system provided for the generation of vapor includes a controlled power circuit for varying the level of electrical heating of a selected vaporizer.

31. The ion implanter ion source system of claim 29 in which the path is substantially horizontal and the conductive body is mounted below the path in position not to interfere with ion source installation and removal movement.

32. An ion beam implantation system comprising a vacuum chamber that houses a removable ion source and a beam line for ions from the ion source, a heated vapor delivery device constructed to deliver ionizable vapor to the ion source from its housing, the vapor delivery device defining a mounting station for a vaporizer unit and a passage for a controlled flow of vapor to the ion source, the vapor delivery device constructed and positioned to enable removal of the ion source from its housing without disturbance of the vapor delivery device.

33. The ion beam implantation system of claim 32 in which the vapor delivery device is substantially supported by an electrically insulating bushing which also supports the ion source.

34. The ion beam implantation system of claim 33 in which a delivery extension of the vapor delivery device into the vacuum chamber removably connects to an inlet passage of the ion source within the chamber.

35. The ion beam implantation system of claim 34 in which the vapor delivery device comprises a heated conductive metal valve block that houses valves that control flow of the vapor to the ion source.

* * * * *